(12) United States Patent
Lesso et al.

(10) Patent No.: US 12,720,766 B2
(45) Date of Patent: Aug. 25, 2026

(54) MULTI-LEVEL MEMRISTOR ELEMENTS

(71) Applicant: Cirrus Logic International Semiconductor Ltd., Edinburgh (GB)

(72) Inventors: John P. Lesso, Edinburgh (GB); James T. Deas, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 94 days.

(21) Appl. No.: 18/600,957

(22) Filed: Mar. 11, 2024

(65) Prior Publication Data

US 2024/0251565 A1 Jul. 25, 2024

Related U.S. Application Data

(63) Continuation-in-part of application No. 18/323,838, filed on May 25, 2023, now Pat. No. 12,200,946, which is a continuation of application No. 17/308,695, filed on May 5, 2021, now Pat. No. 11,696,452, which is a continuation of application No. 16/781,157, filed on Feb. 4, 2020, now Pat. No. 11,018,186.

(Continued)

(30) Foreign Application Priority Data

May 30, 2019 (GB) ..................................... 1907685

(51) Int. Cl.

| | |
|---|---|
| ***H10B 61/00*** | (2023.01) |
| ***G06N 3/02*** | (2006.01) |
| ***G11C 11/16*** | (2006.01) |
| ***G11C 16/04*** | (2006.01) |
| ***H10N 50/10*** | (2023.01) |

(52) U.S. Cl.

CPC ............... *H10B 61/10* (2023.02); *G06N 3/02* (2013.01); *G11C 11/165* (2013.01); *H10N 50/10* (2023.02)

(58) Field of Classification Search

CPC ............ G11C 13/0069; G11C 13/0004; G11C 13/0007; G11C 2213/79; G11C 2213/72; G11C 11/165; G11C 16/0475; H10B 61/10; G06N 3/02; H10N 50/10

USPC .................................................. 365/158, 148

See application file for complete search history.

(56) References Cited

U.S. PATENT DOCUMENTS

| | | | |
|---|---|---|---|
| 3,979,735 | A | 9/1976 | Payne |
| 5,585,795 | A | 12/1996 | Yuasa |

(Continued)

FOREIGN PATENT DOCUMENTS

| | | | |
|---|---|---|---|
| CN | 107293642 | A | 10/2017 |
| CN | 109086249 | A | 12/2018 |

(Continued)

OTHER PUBLICATIONS

Translation of CN 113541691 A (Year: 2021).*

(Continued)

*Primary Examiner* — Pho M Luu
*Assistant Examiner* — Elizabeth Rose Agger
(74) *Attorney, Agent, or Firm* — Jackson Walker L.L.P.

(57) ABSTRACT

There is described a two-terminal multi-level memristor element synthesised from binary memristors, which is configured to implement a variable resistance based on unary or binary code words. There is further described a circuit such as a synapse circuit implemented using a multi-level memristor element.

18 Claims, 19 Drawing Sheets

Related U.S. Application Data

(60) Provisional application No. 62/801,895, filed on Feb. 6, 2019.

(56) References Cited

U.S. PATENT DOCUMENTS

| | | | |
|---|---|---|---|
| 6,252,795 B1 | 6/2001 | Hansen et al. | |
| 6,448,815 B1 * | 9/2002 | Talbot | H04L 25/028 326/86 |
| 8,773,913 B1 | 7/2014 | Zonte | |
| 10,079,059 B2 | 9/2018 | Buchanan | |
| 11,018,186 B2 | 5/2021 | Lesso et al. | |
| 11,696,452 B2 | 7/2023 | Lesso et al. | |
| 12,067,048 B1 | 8/2024 | Blaney | |
| 2004/0084710 A1 * | 5/2004 | Baker, Jr. | H10B 69/00 257/311 |
| 2011/0280058 A1 * | 11/2011 | Chen | G11C 11/5685 365/189.15 |
| 2013/0069141 A1 | 3/2013 | Pan | |
| 2018/0075904 A1 | 3/2018 | Ge et al. | |
| 2018/0300618 A1 | 10/2018 | Obradovic et al. | |
| 2018/0358097 A1 | 12/2018 | Lee | |
| 2019/0244662 A1 | 8/2019 | Lee | |
| 2020/0234111 A1 | 7/2020 | Tran | |
| 2021/0257405 A1 | 8/2021 | Lesso | |
| 2022/0374698 A1 | 11/2022 | Gosson | |

FOREIGN PATENT DOCUMENTS

| | | | | |
|---|---|---|---|---|
| CN | 109217827 A | | 1/2019 | |
| CN | 109273035 A | | 1/2019 | |
| CN | 113541691 A | * | 10/2021 | G11C 13/0004 |
| KR | 20170108627 A | | 9/2017 | |
| WO | 2015163927 A1 | | 10/2015 | |
| WO | 2018051931 A1 | | 6/2019 | |

OTHER PUBLICATIONS

International Search Report and Written Opinion of the International Searching Authority, International Application No. PCT/GB2024/050655, mailed Sep. 27, 2024.

Du, Yuan et al., An Analog Neural Network Computing Enging Using CMOS-Compatible Charge-Trap-Transistor (CTT), IEEE Transactions on Computer-Aided Design of Integrated Circuits and Systems, IEEE, USA, vol. 38, No. 10, Oct. 1, 2019, pp. 1811-1819.

Combined Search and Examination Report under Sections 17 and 18(3), UKIPO, Application No. GB1907685.0, mailed Sep. 25, 2019.

* cited by examiner

10

A
B
12
ω

BL
WL
16
S1
S2
S3
S4
A
M0
M1
M2
B
12a
10
14

A
B
12a
PCM
17
ω

A
B
12a
PCM
17

DEM
ω
18

| Input Code | Linear R | Linear Conductance |
|---|---|---|
| 1 | 1 | 0 |
| 2 | 2 | 1 |
| 3 | 3 | 1 |
| 4 | 4 | 2 |
| 5 | 5 | 3 |
| 6 | 6 | 4 |
| 7 | 7 | 5 |
| 8 | 8 | 6 |
| 9 | 9 | 7 |
| 10 | 10 | 8 |
| 11 | 11 | 9 |
| 12 | 12 | 10 |
| 13 | 13 | 12 |
| 14 | 14 | 13 |
| 15 | 15 | 15 |
| 16 | 16 | 16 |

MULTI-LEVEL MEMRISTOR ELEMENTS

BACKGROUND

Embodiments of the present disclosure relate to multi-level memristor elements and to methods and apparatus incorporating multi-level memristor elements, such as synapse circuits and neural networks using multi-level memristor elements.

Analog computing is where computing operations are performed using variations in the voltage and/or current levels of data signals. As such, analog computing provides an alternative to traditional digital computing systems, where such operations are performed using binary data. An advantage provided by analog computing systems is that such computing systems can be tailored for low power operation. This makes analog computing systems particularly suited for low-power, always-on applications, e.g. edge computing applications. The concept of "edge computing" moves at least some computational load associated with processing for some applications, which may conventionally have been performed by some central computing facilities, to the "edge devices", such as smartphones, tablet computers etc. that collect the relevant data to be processed. This can significantly reduce the computing burden on the central facilities.

For relatively time-critical systems, e.g. speech processing, the traditional Von Neumann computing architecture presents a bottleneck for carrying out any computing operations, where a processor module must access a separate memory module to retrieve data, and subsequently writes the output of any processing operations back to the memory for future use. The continual reading and writing of data between the processor and the memory consumes processing cycles and/or power, thereby limiting the overall efficiency of analog computing systems intended for low-power, fast-response operations.

In an attempt to address such a bottleneck, memristors have been suggested as an option for implementing in-processor memory. A memristor can be described as a resistor with memory, where the resistance of a memristor can be programmed based on voltage and/or current applied to the memristor.

As a result, an analog computing operation can be performed based on variations in current flow through the memristor, by adjusting the impedance of the memristor.

Memristors may be provided as binary memristors or multi-level or analog memristors. A symbol for a binary memristor is indicated at 10 in FIG. 1. Binary memristors are so-called as they are switchable between two different impedance states—which may be identified as a high impedance (or resistance) state (HI) or a low impedance (or resistance) state (LO). Analog memristors allow for more continuous variations in the impedance of the memristor element. However, such analog memristors present considerable manufacturing challenges, and difficulties in ensuring consistent operation between devices.

In addition, the general use of memristor-based elements in low-power, always-on applications, for instance in edge computing applications, presents continual challenges in the balancing of power consumption, accuracy, and processing speed. One such application area is for synapse circuits of machine learning systems, where a weighting value is to be applied to a data input to provide a weighted data output for use in multiply and accumulate operations.

Accordingly, there is a need for a memristor element and also a synapse cell that at least mitigate the above problems.

SUMMARY

Accordingly, there is provided a two-terminal multi-level memristor element synthesised from binary memristors, the multi-level memristor element comprising:

- a plurality of binary memristor portions connected between first and second terminals of the multi-level memristor element, the binary memristor portions individually programmable between HI and LO resistance states,
- wherein the series-connected binary memristor portions can be programmed to provide a variable multi-level resistance between the first and second terminals.

In some embodiments the plurality of binary memristor portions are arranged in series between the first and second terminals of the multi-level memristor element.

Providing a multi-level memristor composed of binary memristors allows for a multi-level device to be synthesised from existing components which can be relatively easily and consistently manufactured.

Preferably, the binary memristors of the multi-level memristor element are from a common process.

That is, the binary memristors used in the multi-level memristor element are matched or scaled, so they have approximately the same dimensions, and/or approximately the same electrical characteristics. The use of matched memristors from a common process allows for the electrical characteristics of the memristors to be of a relatively uniform standard throughout the multi-level memristor element.

Preferably, the multi-level memristor element further comprises switching circuitry, the switching circuitry arranged to apply voltages or currents to individual binary memristor portions of the multi-level memristor element to control the programming of the respective binary memristor portions between HI and LO resistance states.

The switching circuitry may comprise any suitable switching mechanism, e.g. transistor-based switches.

Preferably, the multi-level memristor element further comprises a program control module coupled with the switching circuitry, the program control module arranged to receive input data or weighting data to be applied using the memristor element, and wherein the program control module controls the switching circuitry to program the binary memristor portions of the memristor element based on the received input data or weighting data.

Preferably, the program control module is arranged to control the programming of the binary memristor portions of the memristor element based on the received input data or weighting data to provide for a linear variation of conductance of the memristor element based on the received input data or weighting data.

Preferably, the multi-level memristor element is configured to implement unary coding or binary coding, wherein a unary code word or a binary code word is used to define the resistance level of the multi-level memristor element.

Preferably, the number of binary memristor portions arranged in series corresponds to the length of the unary or binary code word. Accordingly, each of the binary memristor portions of the multi-level memristor element are configured to implement a bit of the unary code word or the binary code word.

In some embodiments, the multi-level memristor element further comprises at least one offset resistor r0 arranged in series with the plurality of binary memristor portions.

The offset resistor r0 is selected to limit the absolute value of current allowed to pass through the multi-level memristor element, and thereby linearize the operation of the multi-level memristor element. It will be understood that the offset resistor r0 may be positioned among the series-connected binary memristor portions. That is, the provision of the offset resistor r0 in series with the binary memristor portions is not limiting to the actual location of the offset resistor within the memristor element.

Preferably, the resistance of the at least one offset resistor r0 is selected such that r0 is greater than the maximum total resistance contribution of the combined binary memristor portions of the element. Preferably, the value of r0 is selected to be greater than the combined resistance of the binary memristor portions of the memristor element, when the binary memristor portions are set to the HI resistance state.

In some embodiments, r0>>R(LO), where R(LO) (also referred to as R(low)) is the resistance of the LO resistance state of the binary memristors of the multi-level memristor element. In other embodiments, r0>>R(HI), where R(HI) (also referred to as R(high)) is the resistance of the HI resistance state of the binary memristors of the multi-level memristor element.

Unary Coding Approach

For a unary coding implementation, the binary memristor portions each comprise a binary memristor.

Preferably, the multi-level memristor element is configured to perform dynamic element matching of the binary memristor portions.

Dynamic element matching means that for a particular unary code word, the assignment of the bits of the code word among the binary memristor portions of the multi-level memristor element is rotated or varied for a number of cycles of that particular code word.

By rotating or varying the bit assignments of the code word among the binary memristor portions, accordingly any mismatches of electrical characteristics between binary memristor portions is compensated for or rotated out of the resultant output signal.

Preferably, the multi-level memristor portion comprises a dynamic element matching (DEM) module coupled with switching circuitry of the multi-level memristor portion, the DEM module arranged to receive a unary code word to define the resistance level of the multi-level memristor element, and wherein the DEM module controls the programming of the binary memristor portions of the multi-level memristor element to vary the bit assignments of the unary code word among the binary memristors of the multi-level memristor element. The DEM module is arranged to vary the bit assignments during use of the memristor element.

Binary Coding Approach

For the binary coding implementation, preferably, the binary memristor portions are configured such that the difference in impedance between the HI and LO resistance states (delta R) of a first binary memristor portion is scaled relative to the (delta R) of the other binary memristor portions of the multi-level memristor element.

Preferably, the binary memristor portions are configured such that the variation in (delta R) across binary memristor portions of the multi-level memristor element follows a binary scale.

For a binary scale, it will be understood that the (delta R) of a first binary memristor portions is different to the (delta R) of the other binary memristor portions, wherein the (delta R) of binary memristor portions corresponding to adjacent bits of a binary code word differ by a factor of two.

Alternatively, the binary memristor portions are configured such that the variation in (delta R) across binary memristor portions of the multi-level memristor element is non-linearly scaled.

It will be understood that the selection of binary memristor portions may be configured to provide different scaling of the resistance levels of the memristor element, to provide a non-linear quantization of the weighting to be applied to a data signal. For example, the variation in (delta R) across binary memristor portions of the multi-level memristor element may be logarithmically scaled, may be scaled according to the mu-law algorithm, or may be scaled according to the A-law algorithm.

Preferably, for the binary coding implementation, a first binary memristor portion of the multi-level memristor element comprises a single binary memristor.

In one embodiment, at least one of the series-connected binary memristor portions comprises a binary memristor and a parallel shunt resistor, wherein the resistance of the parallel shunt resistor is selected to provide for a (delta R) of the binary memristor portion which is scaled relative to the other binary memristor portions of the multi-level memristor element.

Additionally or alternatively, at least some of the series-connected binary memristor portions may each comprise first and second resistance components, wherein the first resistance component is connected in series with the other binary memristor portions and the second resistance component is connected in parallel with the first resistance component, wherein one of the first and second resistance components is a binary memristor and the other of the first and second resistance components is a shunt resistor. For at least one of the binary memristor portions the second resistance component may be connected in parallel with the series connection of first resistance components from a plurality of binary memristor portions.

Additionally or alternatively, at least one of the series-connected binary memristor portions comprises a bank of binary memristors connected in parallel, the bank of binary memristors of a particular memristor portion being simultaneously switchable between HI and LO resistance states, wherein the number of parallel-connected binary memristors within the binary memristor portion is selected to provide for a (delta R) of the binary memristor portion which is scaled relative to the other binary memristor portions of the multi-level memristor element.

It will be understood that the multi-level memristor element may comprise a combination of different configurations of binary memristor portions, for example a first subset of the binary memristor portions may comprise a bank of binary memristors connected in parallel, the bank of binary memristors of a particular memristor portion being simultaneously switchable between HI and LO resistance states, and a second subset of the binary memristor portions may comprise a binary memristor and a parallel shunt resistor.

The combined use of such different configurations of binary memristor portion allows for the multi-level memristor element to be balanced for area and efficiency of operation.

It will be understood that the layout of binary memristor portions of a multi-level memristor element may be configured in any suitable manner and is not necessarily limited to a layout corresponding to a particular bit-order or endianness.

In one aspect there is provided a two-terminal multi-level memristor element synthesised from binary memristors, the multi-level memristor element comprising:

a plurality of binary memristor portions arranged in series between first and second terminals of the multi-level memristor element, the binary memristor portions individually programmable between HI and LO resistance states, wherein the series-connected binary memristor portions can be programmed to provide a variable multi-level resistance between the first and second terminals.

In one aspect there is provided a two-terminal multi-level resistance element synthesised from binary programmable-resistance memory components, the multi-level resistance element comprising: a plurality of binary programmable-resistance memory portions connected between first and second terminals of the multi-level resistance element, the binary programmable-resistance memory portions individually programmable between HI and LO resistance states, wherein the connected binary memristor portions can be programmed to provide a variable multi-level resistance between the first and second terminals.

In one aspect there is provided a programmable resistance element, the programmable resistance element comprising a plurality of programmable-resistance memory components arranged in combination between first and second terminals of the programmable resistance element to define a plurality of programmable portions, wherein each programmable portion comprises one or more of said programmable-resistance memory components configured such that each programmable portion can be individually programmed to a selected one of two different resistance states, and wherein said plurality of programmable portions can be programmed in combination to provide a selected one of more than two values of overall resistance between the first and second terminals.

Synapse Circuit

There is further provided a synapse circuit for a neural network system comprising a two-terminal multi-level memristor element.

Preferably, the synapse circuit comprises a multi-level memristor element synthesised from binary memristors, as in any of the above-described embodiments. Alternatively, the synapse circuit comprises an analog memristor element, as in a continuously-variable memristor component. It will be understood that the synapse circuit may comprise memory elements in the form of MRAM (magnetic RAM), such as STTRAM (Spin-Transfer Torque RAM), and/or ReRAM (Resistive RAM), such as Transition Metal Oxide-based RAM.

Preferably, the synapse circuit comprises:

an input to receive at least one data input signal indicative of a data input, the data input signal provided as a voltage or current;

an output to provide at least one data output current indicative of the data input times a defined weighting value; and at least first and second data paths between the input and the output, the data paths comprising a two-terminal multi-level memristor element, wherein the at least one data input signal is applied to at least one of the data paths, wherein the resistance level of at least one multi-level memristor element is adjusted based on the defined weighting value, and wherein the data output current is based on the current through said at least first and second data paths.

Preferably, the synapse circuit further comprises:

a weighting input to receive at least one weighting value indicative of a weighting to be applied to the data input, wherein the resistance level of at least one multi-level memristor element is adjusted based on the received weighting value.

Preferably, the synapse circuit comprises at least one offset resistor R0 provided in each of the at least first and second data paths, the at least one offset resistor R0 arranged in series with the multi-level memristor element.

The offset resistor R0 is selected to limit the absolute value of current allowed to pass through the multi-level memristor element, and thereby to linearize the operation of the synapse circuit. Preferably, the resistance of the at least one offset resistor R0 is selected such that R0 is selected to be greater than the resistance of the multi-level memristor element, when the multi-level memristor element is set to the HI resistance state.

In one embodiment, the resistance of the at least one offset resistor R0 is selected such that R0>>R(LO), where R(LO) is the resistance of the LO resistance state of the binary memristors of the multi-level memristor element. In other embodiments, R0>>R(HI), where R(HI) is the resistance of the HI resistance state of the binary memristors of the multi-level memristor element.

It will be understood that the offset resistor R0 may be used in addition to, or as an alternative to, an offset resistor r0 provided as part of the multi-level memristor element.

In one aspect, the synapse circuit is arranged such that:

the first data path is configured as a weighting path, wherein the resistance level of the multi-level memristor element of the first data path is adjusted based on the at least one weighting value, to provide a weight-dependent data current flowing through the weighting path, and the second data path is configured as a reference path, wherein the resistance level of the multi-level memristor element of the second data path is set at a defined level, to provide a weight-independent reference current flowing through the reference path, wherein the data output current is based on the difference between the weight-dependent data current and the weight-independent reference current.

As memristors may have a data-dependent offset current, providing a reference path allows for the offset current to be compensated for in the resulting output current, by subtracting the weight-dependent data current from the weight-independent reference current or vice versa. As a result, the data output to be derived from the output data current is effectively based on the difference in resistance between the two paths.

The defined resistance level of the multi-level memristor element of the second data path may be selected based on the characteristics of the synapse circuit or the associated application of the synapse circuit, the characteristics of the at least one data input voltage, and/or the desired characteristics of the data output current.

In one aspect, the defined resistance level of the multi-level memristor element of the second data path may be such that the multi-level memristor element is in a LO resistance state. In an alternative aspect, the defined resistance level of the multi-level memristor element of the second data path may be such that the multi-level memristor element is in a HI resistance state. In a further aspect, the defined resistance level of the multi-level memristor element of the second data path may be such that the multi-level memristor element is in a specified resistance state between the HI and LO resistance states, e.g. mid-way between the HI and LO resistance states.

In an alternative aspect, the synapse circuit is arranged such that:

the first data path is configured as a positive weighting path, wherein the resistance level of the multi-level memristor element of the first data path is adjusted based on a positive component of the at least one weighting value, to provide a positively-weighted data current flowing through the positive weighting path, and the second data path is configured as a negative weighting path, wherein the resistance level of the multi-level memristor element of the second data path is adjusted based on a negative component of the at least one weighting value, to provide a negatively-weighted data current flowing through the negative weighting path, and wherein the data output current is based on the difference between the positively- and negatively-weighted data currents.

In a further alternative aspect, the synapse circuit is arranged such that:

an input is arranged to receive a differential data input signal indicative of a data input, the data input signal being differentially coded as a non-inverse signal and an inverse signal;

the first data path is configured as a weighting path to apply a weighting to the non-inverse signal, wherein the resistance level of the multi-level memristor element of the first data path is adjusted based on the at least one weighting value, to provide a first weighted current, and the second data path is configured as a weighting path to apply a weighting to the inverse signal, wherein the resistance level of the multi-level memristor element of the second data path is adjusted based the at least one weighting value, to provide a second weighted current, and wherein the data output current is based on the difference between the first and second weighted currents.

Preferably, the multi-level memristor elements of the first and second data paths are configured such that the weights of the first and second paths are the same.

The synapse circuit is configured wherein at least a portion of the data input voltage is applied across both the first and second data paths, and wherein the resistance level of the multi-level memristor element of the respective first and second data paths is adjusted based on that portion of the data input voltage applied across the respective data paths.

For example, the data input voltage may comprise separate positive and negative portions which are applied across respective first and second data paths, wherein the resistance level of the multi-level memristor element is selected based on the positive and negative portions of the at least one weighting value.

The synapse circuit may be configured to implement a differential data system. The use of such a differential data system may compensate for any data-dependent offset current present in the synapse circuit, thereby removing the need for a separate reference path.

There is further provided a neural network comprising a synapse circuit as in any of the above-described embodiments.

Preferably, there is provided a neuron circuit comprising:

at least one synapse circuit as in any of the above-described embodiments, and a non-linearity module to apply a non-linearity to the output of the at least one synapse circuit.

Preferably, the neuron circuit comprises a plurality of synapse circuits, and wherein the non-linearity module applies a non-linearity to the sum or difference of the outputs of the synapse circuits.

BRIEF DESCRIPTION OF THE DRAWINGS

Embodiments of the present disclosure will now be described, by way of example only, with reference to the accompanying drawings, in which:

FIGS. 4(*a*) and 4(*b*) illustrate embodiments of multi-level memristor elements provided with programming control modules and in one instance a dynamic element matching module;

DETAILED DESCRIPTION

Figures 1, 2, 3, 4A, 4B:
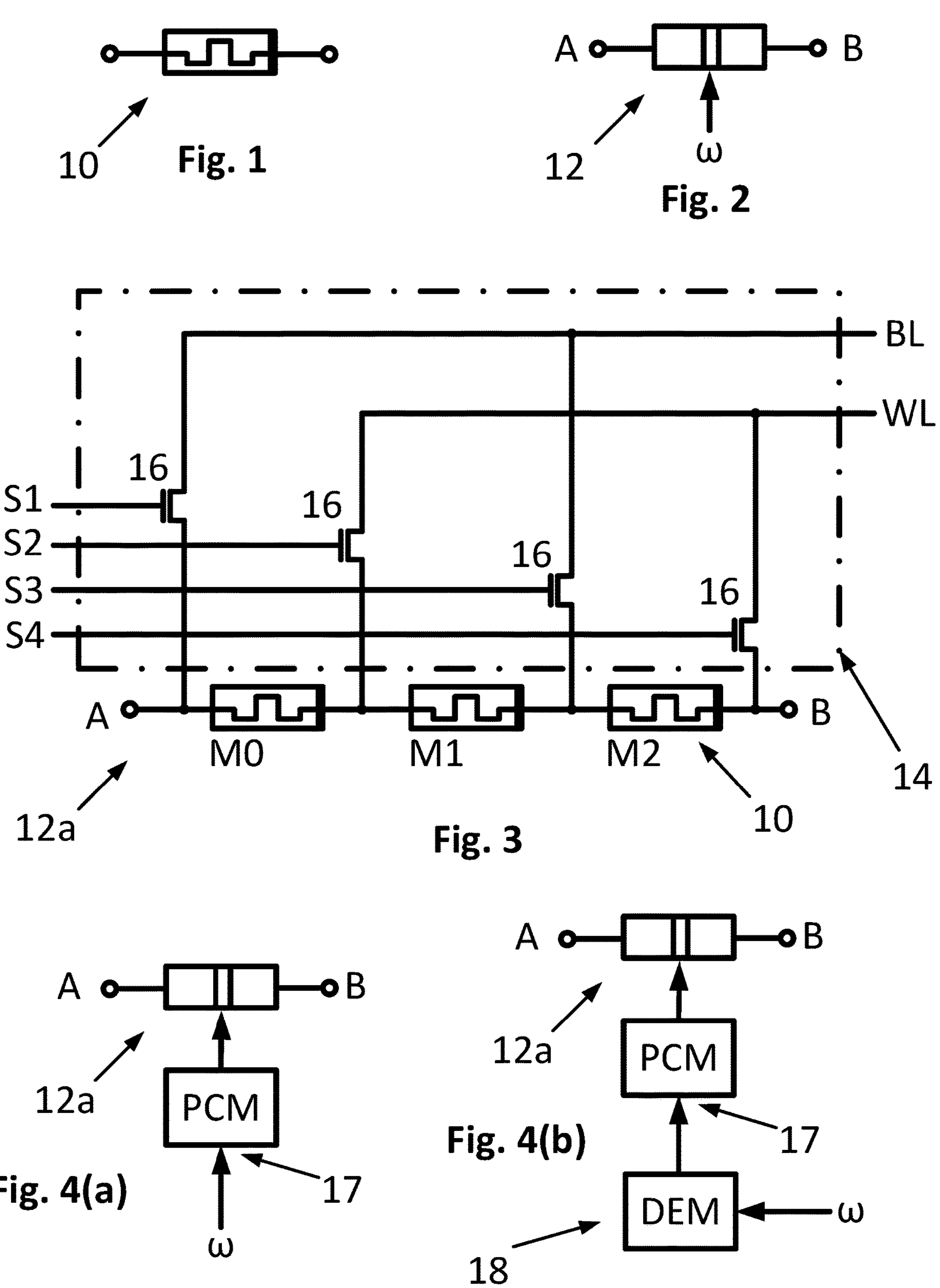
FIG. 1 illustrates a symbol for a binary memristor.
FIG. 2 illustrates a symbol for a two-terminal multi-level memristor element synthesised from binary memristors, according to an aspect of the present disclosure.
FIG. 3 illustrates a first construction of multi-level memristor element according to the present disclosure, incorporating switching circuitry.

With reference to FIG. 2, a symbol for a multi-level memristor element synthesised from binary memristors is indicated at 12. The memristor element 12 comprises an input terminal A, and an output terminal B. The memristor element 12 is configured such that it may receive a signal indicative of a weighting value ω, wherein the resistance level of the memristor element 12 across the terminals A and B is variable based on the value of ω.

The multi-level memristor element 12 is synthesised from a plurality of binary memristors 10, the binary memristors 10 configured in such a way to implement an adjustable resistance, based on the weighting value ω. In other words the multi-level memristor element 12 comprises a plurality of binary memristors 10 which are configured such that resistance (or equivalently the conductance) between the terminals A and B can be selectively programmed to any of more than two different values, so as to represent the desired weighting value ω. It will be appreciated that as the binary memristors 10 can be programmed to a particular resistance state which will persist, the memristors of the multi-level memristor element 12 may be programmed, e.g. in a programming phase, to effectively store the weighting value w. Subsequently the multi-level memristor element 12 could be used, for example as part of a computing operation, with a voltage or current applied to the terminal A so that the current or voltage at the terminal B depends, at least partly, on the weighting value ω. As will be explained in more detail below, the multi-level memristor element 12 may have one or more control inputs which may be active during a programming phase. In use, however, when an input signal of interest is applied to terminal A, the multi-level memristor element 12 will generally have already been programmed to a desired weighting value ω and there may thus be no need for the control inputs to be active. Thus the multi-level memristor element 12 can thus be seen as a two-terminal device, e.g. with an input applied to terminal A to generate an output at terminal B.

Preferably, the binary memristors of the multi-level memristor element are matched or scaled, such that the memristors have approximately the same dimensions, and/or approximately the same electrical characteristics. Such matched memristors may be provided by manufacturing the individual memristors as part of a common process. The use of memristors from a common process allows for the electrical characteristics of the memristors to be of a relatively uniform standard throughout the multi-level memristor element.

With reference to FIG. 3, a first construction of a multi-level memristor element 12 is indicated at 12*a*. In the embodiment of FIG. 3, the memristor element 12*a* comprises a plurality of binary memristors 10 connected in series between the input and output terminals A, B, the individual binary memristors 10 referenced as M0, M1, M2. While the embodiment of FIG. 3 illustrates a system having three series-connected binary memristors 10, it will be understood that any number of binary memristors 10 may be used in the memristor element 12*a*, depending on the required resolution of the memristor element.

The memristor element 12*a* is further provided with switching circuitry indicated by broken line outline at 14, which allows for the programming of resistance states of individual binary memristors 10 by the application of suitable switching voltages or currents across the individual binary memristors 10. The switching circuitry 14 comprises a plurality of switches, in this case MOSFET switches 16. The MOSFET switches 16 are each connected with a node of the series-connection of binary memristors 10, with alternating connections to different control inputs, in this example a Bit Line (BL) and a Word Line (WL). The gate of each MOSFET switch 16 is connected to separate control inputs, e.g. to receive control signal S1, S2, S3, S4. Based on the weighting value ω, by appropriate control of the Bit Line (BL) and Word Line (WL), and of the individual control signals S1, S2, S3, S4, accordingly the voltage or charge applied across each of the individual binary memristors 10 can be adjusted to individually program each of the binary memristors 10 between a high (HI) resistance state and a low (LO) resistance state. Accordingly, the overall resistance of the memristor element 12*a* can be configured by switching of the signals S1, S2, S3, S4, BL and WL.

It will be understood that the binary memristors may be programmed to the desired resistance state HI or LO by application of a suitable voltage of a sufficient magnitude. In general a voltage of a first polarity and magnitude may be applied to programme the memristor to one state, say HI, and a voltage of opposite polarity but the same or similar magnitude may be applied to programme the memristor to the other state, say LO. The voltages of the bit line and word line may thus be controlled to voltages that differ by the required programming voltage and the switches across each memristor controlled appropriately to generate a voltage of appropriate polarity across the memristors to be programmed to a particular state.

The switches are also controlled to prevent applying an unwanted voltage of sufficient magnitude across a memristor which it is not desired to programme at that time. In some embodiments, if a first memristor is being programmed to one state, and thus has a voltage applied to a node of the series connection to generate a voltage of one polarity across the first memristor, the voltage applied to the first node may also be applied to a second, adjacent memristor of the series connection. In this case the voltage on the other side of the second adjacent memristor may be controlled to a level such that voltage across the second memristor is lower than the magnitude required from programming. In some examples the switching circuitry 14 could be configured to connect one side of a memristor which is not to be programmed to an intermediate bias level such that the voltage across that memristor will be lower than the magnitude required for programming.

With reference to FIG. 4(*a*), the memristor element 12*a* may be provided with a programming control module (PCM) 17 which receives a weighting value ω and interprets or converts the weighting value ω into an appropriate programming configuration for the switching circuitry 14. The programming configuration is calculated to set the HI and LO resistance states of the binary memristors M0, M1, M2 to provide an overall resistance of the memristor element 12*a* corresponding to the weighting value ω. An alternative control scheme which can be implemented by the programming control module 17 will be described below. It will be understood that the PCM 17 may be provided as an integrated component of the memristor element 12*a*, or may be provided as an adjacent component which is configured to interface with the switching circuitry 14 of one or more memristor elements. Thus, in some examples the multi-level memristor element 12*a* may receive the weighting value ω itself, in any suitable form, and derive suitable control signals for the switching circuitry 14. In other examples the multi-level memristor element 12*a* may receive suitable control signals at the control inputs to control programming of the multi-level memristor element 12*a*. It will be understood of course that such control signals are themselves indicative of the desired weighting value ω.

It will also be understood that the weighting value ω may, in some embodiments, only be actively provided to the PCM 17 for a programming phase, for example if it is needed to reconfigure the multi-level memristor element 12*a* to store a new weighting value ω. Once suitably programmed, the multi-level memristor element 12*a* may effectively store the weighting value ω. In some examples however the PCM may be configured to periodically transition the multi-level memristor element 12*a* between different configurations that correspond to the same weighting value w, for dynamic matching or error reduction purposes, as will be described in more detail below, in which case the PCM may retain or continue to receive an indication of the required weighting value ω. It will be understood that references in this disclosure to receiving a weighting value will include receiving a weighting value at just one or more points in time ahead of a respective programming phase, which may occur prior to a computing phase in which a signal of interest is applied to terminal A to generate an output at terminal B as part of a compute operation. References herein to receiving a weighting value also include retrieving some indication of the weighting value from some other memory of a host device.

The construction of FIG. 3 is suitable for implementation of a unary coding scheme, wherein the weighting value ω is received as or converted to a unary code word defining the desired resistance level of the memristor element 12*a*. Unary coding is where each bit has the same effect on overall resistance, for instance a thermometer coding technique. In at least some implementations, for an ideal memristor element, a LO resistance state would have a resistance of 0 ohms. However, current memristor manufacturing processes result in memristors having non-zero resistance level in the LO resistance state, but with a resistance which is reduced compared to that in the HI resistance state. Accordingly, the information encoded by the memristor element can be seen by the change in the resistance level between the HI and LO resistance states, referred to herein as the (delta R) of the memristor.

Circuits configured to track the (delta R) of the memristor, particularly synapse circuits for artificial neural networks, are described in further detail below.

As the binary memristors 10 may be subject to process variations resulting in inconsistencies in the exact values of the resistances of the binary memristors 10, in some embodiments the multi-level memristor element 12*a* of FIG. 3 may be arranged to facilitate dynamic element matching (DEM). With reference to FIG. 4(*b*), the memristor element 12*a* is provided with a DEM module 18 which is configured to receive the indication of the weighting value ω, which may, for example, be in the form of a unary code word, and to control the PCM 17 and the switching circuitry 14 to program the binary memristors M0, M1, M2 such that for a particular unary code word, the assignment of the bits of the code word among the binary memristors 10 of the multi-level memristor element 12*a* is periodically varied (where possible). For instance the assignment of the bits of the code word among the binary memristors 10 of the multi-level memristor element 12*a* may be rotated or varied for a number of cycles of that particular code word. By rotating or varying the bit assignments of the code word among the binary memristor portions, accordingly any mismatches of electrical characteristics between binary memristor portions is compensated for or rotated out of the resultant output signal. The DEM module 18 may be configured to rotate the bit assignment of the weights at a greater or lesser frequency than the input data rate.

While the embodiment illustrated in FIG. 3 is particularly suited to implement a unary-coded variable resistance element, other constructions may be used for the implementation of a binary-coded variable resistance element.

Figure 5:
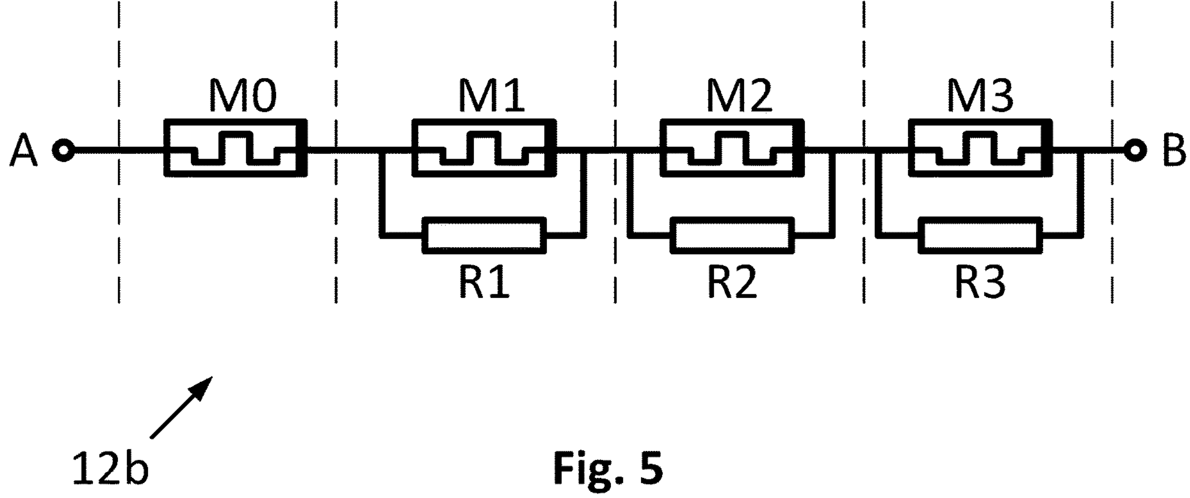
FIG. 5 illustrates a second construction of multi-level memristor element according to the present disclosure.

With reference to FIG. 5, a second construction of a multi-level memristor element 12 is indicated at 12*b*. In the embodiment of FIG. 5, the memristor element 12*b* comprises a plurality of binary memristor portions demarcated by the broken lines of FIG. 5, the binary memristor portions comprising binary memristors 10 connected in series between the input and output terminals A, B, the individual binary memristors 10 referenced as M0, M1, M2, M3. While, in this example, the first binary memristor portion comprises a single binary memristor M0, the subsequent series-connected binary memristor portions each comprise a resistance R1, R2, R3, referred to herein as a shunt resistance, connected in parallel with the respective binary memristors M1, M2, M3. FIG. 5 illustrates each shunt resistance R1, R2, R3 as a single resistor for clarity but it will be appreciated that the shunt resistance may be implemented be more than one resistance in any suitable configuration, e.g. in series, parallel or some series-parallel combination.

For the purposes of clarity, the switching circuitry used to control the programming of the individual binary memristors 10 is omitted from FIG. 5, but it will be understood that the switching circuitry 14 illustrated in FIG. 3 and the PCM 17 illustrated in FIGS. 4(*a*) and 4(*b*) may be adapted for use in the system of FIG. 5.

Again the memristor of each binary memristor portion may be programmed to a selected one of the HI and LO resistance states. However in this embodiment the parallel shunt resistances R1, R2, R3 for each relevant portion can be set to tune the (delta R) of the respective binary memristor portion to a desired value. In other words, the difference in effective resistance of a binary memristor portion between the state in which the relevant memristor is in the HI resistance state compared with the state in which that memristor is in the LO resistance state depends not only on the (delta R) of the memristor itself, but also the value of the shunt resistance (for those memristor portions with a shunt resistance).

For example, the resistance R(L) of the binary memristor portion comprising M1 and R1 when M1 is in the LO resistance state is determined as follows:

$$R_L = \frac{R_1 R_{LOW}}{R_1 + R_{LOW}}$$

Where R(low) is the resistance of the binary memristor M1 when in the LO resistance state.

When M1 is in the HI resistance state, the resistance R(H) of the binary memristor portion comprising M1 and R1 when M1 is in the HI resistance state is determined as follows:

$$R_H = \frac{R_1 \cdot (R_{LOW} + \Delta R)}{R_1 + R_{LOW} + \Delta R}$$

where ΔR is the (delta R) for the binary memristor itself, i.e. the difference in resistance between the HI and LO resistance states of the binary memristor alone. This provides a resultant (delta R) for the binary memristor portion (including the binary memristor and the shunt resistance) equal to R(H)–R(L).

Accordingly, the system can be configured such that there is a specific difference in the effective resistance of a binary memristor portion between the HI and LO resistance states of the binary memristor. By tailoring the system appropriately, the system can allow for data to be encoded to follow a specified output relationship. E.g. for a linear change in the memristive element impedance between successive binary codes, the difference between the HI and LO resistive states of a binary memristor portion should be:

$$\frac{\Delta R}{2^m}$$

where m indicates how far along the encoding bit word the binary memristor portion is located (i.e. what bit of the code word is the binary memristor portion to implement). It will of course be understood that if the first portion itself were to include a shunt resistance, the ΔR in the equation above would be the effective (delta R) for the first memristor portion. It will also be understood that the relative order of the various memristor portions in the series connection could be varied for this example, and the examples described below.

Figure 6:
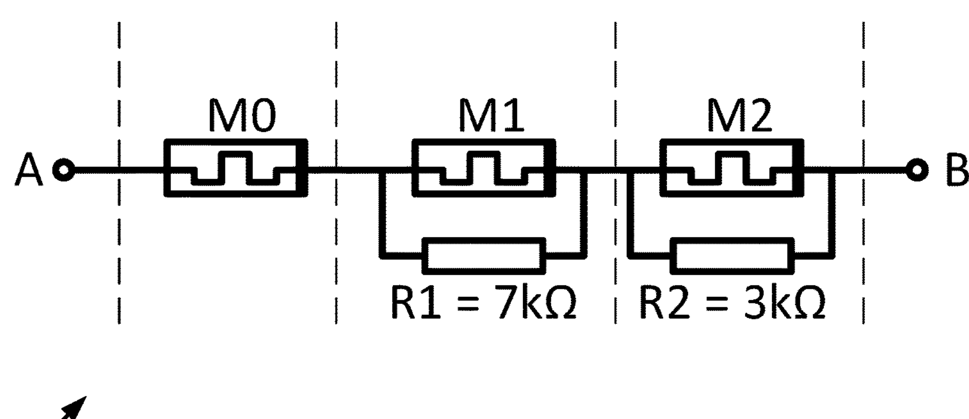
FIG. 6 illustrates an example configuration of the multi-level memristor element of FIG. 5.

FIG. 6 illustrates an example construction of a 3-bit synthesised multi-level memristor element 12*c*, based on the general architecture of FIG. 5.

For binary memristors M0, M1, M2 having R(low)=2kΩ and (delta R)=2kΩ, where the memristor M0 is used to implement the Most Significant Bit (MSB) of the binary code word, M1 implements the next bit of the binary code word, and M2 implements the Least Significant Bit (LSB) of the binary code word.

Accordingly, the effective (delta R) for the binary memristor portions corresponding to the first bit position, i.e. that portion having just the series-connected binary memristor M0 is 2kΩ. To provide a binary scaling of the effective (delta R) for the successive binary memristor portions, accordingly the effective (delta R) for the binary memristor portion comprising memristor M1 and shunt resistor R1 should be 1kΩ, and the effective (delta R) for the binary memristor portion comprising memristor M2 and shunt resistor R2 should be 500Ω. To produce such effective (delta R) values, accordingly R1 is selected as 7kΩ and R2 is selected as 3kΩ.

Figure 7:
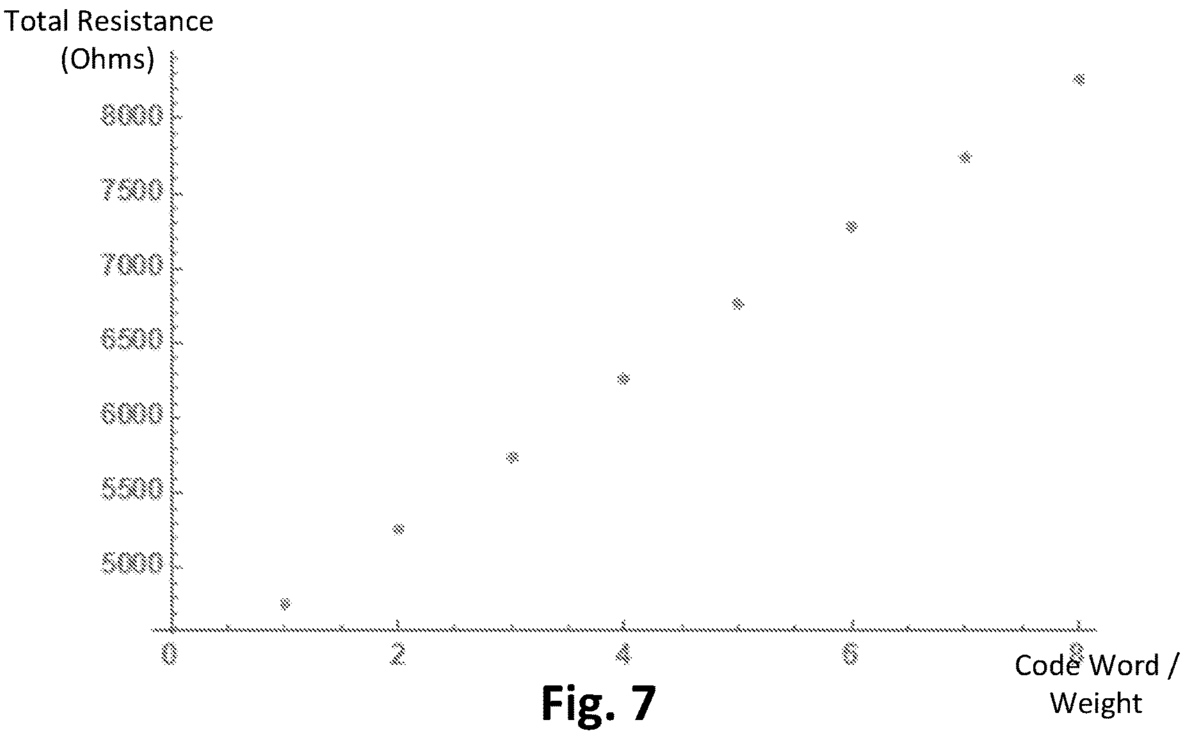
FIG. 7 is a plot of total resistance against programmed weight for the configuration of FIG. 6.

The resultant two-terminal multi-level memristor element 12*c* implements an effective variation of resistance across the two terminals A, B of the element 12*c* based on a 3-bit binary code word to control the switching of the individual binary memristor portion of the element. A plot of the variation of resistance against the decimal equivalent of the binary code (or weighting) is shown in FIG. 7.

Figure 8:
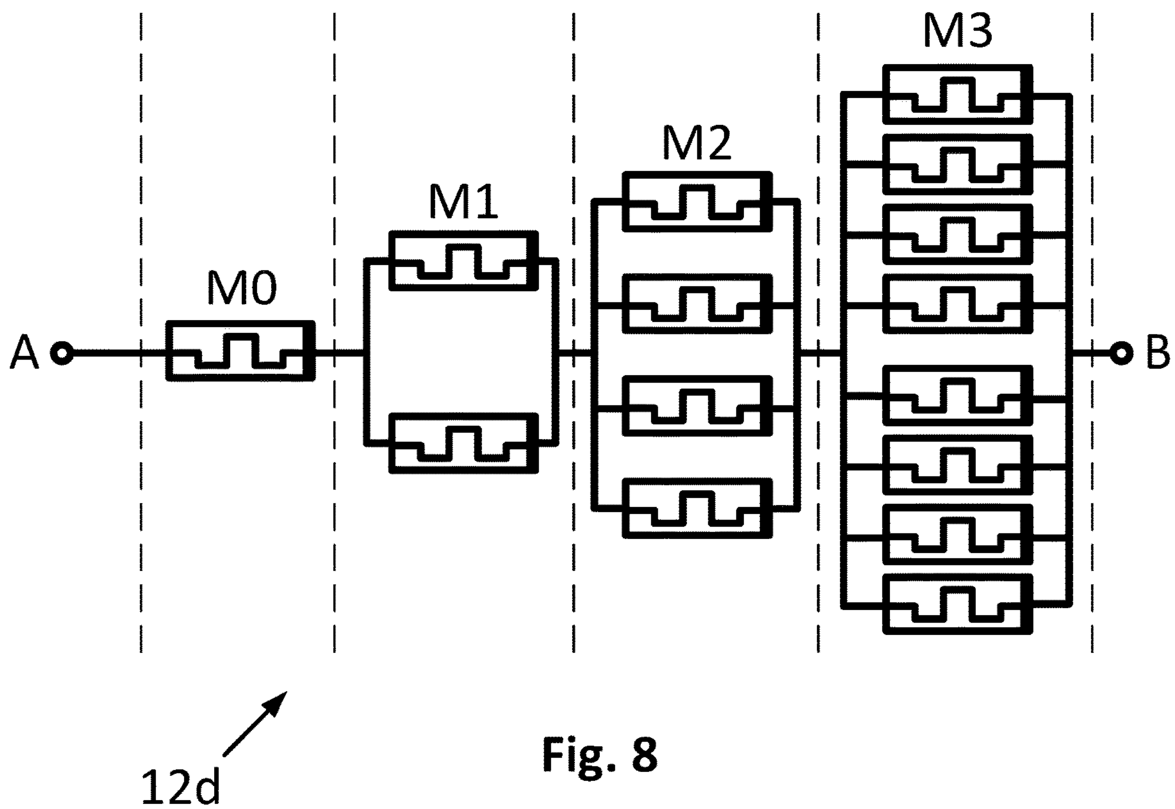
FIG. 8 illustrates a third construction of multi-level memristor element according to the present disclosure.

A third construction of a multi-level memristor element 12 is indicated at 12*d* of FIG. 8. In the embodiment of FIG. 8, the memristor element 12*d* comprises a plurality of binary memristor portions arranged in series between the input and output terminals A, B, the binary memristor portions demarcated by the broken lines of FIG. 8. In the embodiment of FIG. 8, the first binary memristor portion comprises of a single binary memristor M0, while the subsequent series-connected binary memristor portions each comprise banks of binary memristors connected in parallel, resulting in a first bank of the parallel memristors M1, a second bank of the parallel memristors M2, and a third bank of the parallel memristors M3.

For the purposes of clarity, the switching circuitry used to control the programming of the individual binary memristors 10 is omitted from FIG. 8, but it will be understood that the switching circuitry 14 illustrated in FIG. 3 and the PCM 17 illustrated in FIGS. 4(*a*) and 4(*b*) may be adapted for use in the system of FIG. 8. In this case, it will be understood that the memristors of each individual binary memristor portion comprises are commonly programmed between the HI and LO resistance states, so that each binary memristor portion is programmed between an effective HI and LO resistance state.

Figure 9:
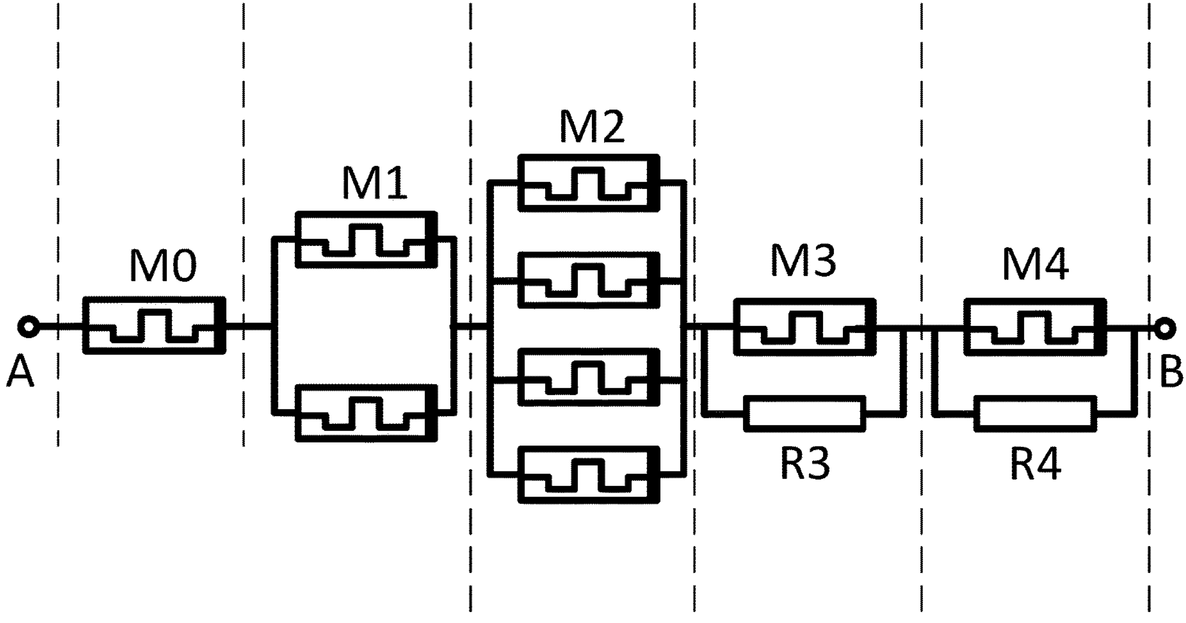
FIG. 9 illustrates a fourth construction of multi-level memristor element according to the present disclosure, being a hybrid of the constructions of FIGS. 5 and 8.

In this construction, the numbers of parallel-connected binary memristors per binary memristor portion increases by a factor of two for each successive portion, thereby ensuring that the effective (delta R) for the individual binary memristor portions follows a binary scale. Accordingly, where the binary memristors of FIG. 9 are all from a common process, the first binary memristor portion having a single memristor M0, has an effective (delta R) corresponding to the (delta R) of the memristor M0, while the second binary memristor portion having a pair of memristors M1 in parallel has an effective (delta R) corresponding to:

$$\frac{\Delta R}{2}$$

Similarly, the fourth binary memristor portion, comprising eight memristors M3 in parallel and representing the Least Significant Bit (LSB) of a 4-bit binary code word, has an effective (delta R) of:

$$\frac{\Delta R}{8}$$

Accordingly, the construction illustrated in FIG. 8 provides an effective linear variation of resistance across the two terminals A, B of the element 12*d*, based on a 4-bit binary code word to control the switching of the individual binary memristor portion of the element.

While the embodiment of FIG. 8 illustrates a system having four binary memristor portions, it will be understood that any number of binary memristor portions may be used in the memristor element 12*d*, depending on the required resolution of the memristor element.

In some embodiments, where the system is intended to implement effective coding of relatively long code words, the use of banks of parallel memristors may require considerable area to implement, to accommodate multiple binary memristors. In such situations, a hybrid construction of binary memristor portions may provide a balance between the power consumption and area of a multi-level memristor element.

With reference to FIG. 9, an example of such a construction is illustrated, for a memristor element 12*e*. The memristor element 12*e* comprises a plurality of binary memristor portions arranged in series between the input and output terminals A, B, the binary memristor portions demarcated by the broken lines of FIG. 9.

In the embodiment of FIG. 9, the first binary memristor portion comprises of a single binary memristor M0, the second binary memristor portion comprises a bank of two binary memristors M1 connected in parallel, the third binary memristor portion comprises a bank of four binary memristors M2 connected in parallel, and the fourth and fifth binary memristor portions respectively comprise binary memristors M3, M4, connected in parallel with respective shunt resistances R3, R4. The values of the shunt resistances R3, R4 are selected such that the effective (delta R) of the fourth and fifth binary memristor portions are scaled relative to the effective (delta R) of the first, second and third binary memristor portions.

For example, assuming the binary memristors of the element 12*e* are from a common process, accordingly the effective (delta R) for the first, second and third binary memristor portions can be easily seen to be respectively equal to:

$$\Delta R, \frac{\Delta R}{2}, \frac{\Delta R}{4}$$

For a linear scaling of the effective (delta R) with code, the shunt resistance R3 is selected such that effective (delta R) of the fourth binary memristor portion as the memristor M3 is switched between the HI and LO resistance states is half that of the effective (delta R) of the third binary memristor portions, i.e.

$$\frac{\Delta R}{8}$$

With the shunt resistance R4 selected such that the effective (delta R) of the fifth binary memristor portion as the memristor M4 is switched between the HI and LO resistance states is equal to:

$$\frac{\Delta R}{16}$$

It will be understood that the switching circuitry is omitted from the illustration of FIG. 9, but switching circuitry similar to the switching circuitry 14 as shown in FIG. 3 and the PCM 17 illustrated in FIGS. 4(*a*) and 4(*b*) may be used to control the programming of the individual binary memristors of the element 12*e* according to the 5-bit binary code word to be programmed to the element 12*e*.

Figure 10A:
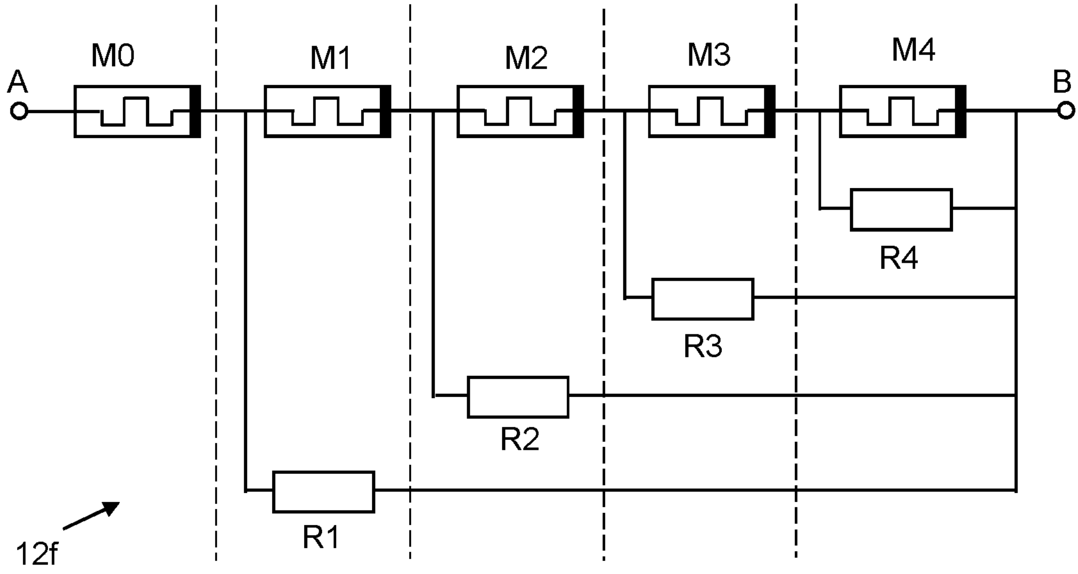
FIGS. 10*a* and 10*b* illustrate a fifth and sixth constructions of a multi-level memristor element according to the present disclosure.

A further example construction of a multi-level memristor element 12 is indicated at 12*f* of FIG. 10*a*. In the embodiment of FIG. 10*a*, the memristor element 12*f* comprises a plurality of binary memristor portions between the input and output terminals A, B, the binary memristor portions demarcated by the broken lines of FIG. 10*a*. In the embodiment of FIG. 10*a*, the first binary memristor portion comprises of a single binary memristor M0 while the subsequent binary memristor portions each comprise a binary memristors M1 to M4 and a respective shunt resistance R1 to R4. In the example of FIG. 10*a* the memristors of each portion are connected in series with one another, but at least some of the respective shunt resistances of the memristor portions are connected in parallel with more than one of the memristors M1 to M4. In the example of FIG. 10*a*, the shunt resistance R1 is connected in parallel with the series combination of memristors M1, M2, M3 and M4, the shunt resistance R2 is connected in parallel with the series combination of memristors M2, M3 and M4, the shunt resistance R3 is connected in parallel with the series combination of memristors M3 and M4 and the shunt resistance R4 with memristor M4 alone. Thus, for the whole multi-level memristor element 12*f*, the shunt resistances are effectively arranged in a nested configuration. As will be understood by one skilled in the art, the effect of at least some shunt resistances are thus effectively applied across multiple memristors. By nesting the shunt resistances in this way, a suitable scaling of the (delta R) for the memristor portions, can be achieved without requiring such a big difference in the values of the individual shunt resistances.

In this example each binary memristor portion includes a memristor, and the memristors of the portions are connected in series between input terminal A and output terminal B. The binary memristor portions can thus be seen to be connected in series. Each binary memristor portion other than the first also has a corresponding shunt resistance, where the relevant shunt resistance is connected in parallel with the relevant memristor (either that memristor on its own or the series connection of that memristor with the memristors of other portions) and one terminal of the relevant shunt resistance is connected to one terminal of the relevant memristor by a path that does not include the memristor or shunt resistance of another memristor portion.

It will be noted that whilst FIG. 10*a* illustrates that the shunt resistance for a given portion is coupled in parallel across the memristor of that portion and all subsequent portions. Other arrangements are possible however, for instance in another arrangement R1 could be coupled across just memristor M1, R2 could be coupled across both M1 and M2, R3 could be coupled across M1, M2 and M3 and so on. In each case however each binary memristor portion (other than, in this example, the first) includes a memristor and a connection to one shunt resistance.

Whilst FIG. 10*a* illustrates the binary memristor portion comprising series connected resistor and nested parallel shunt resistances, in some examples the position of at least some of the memristors and corresponding shunt resistances could be swapped.

Figure 10B:
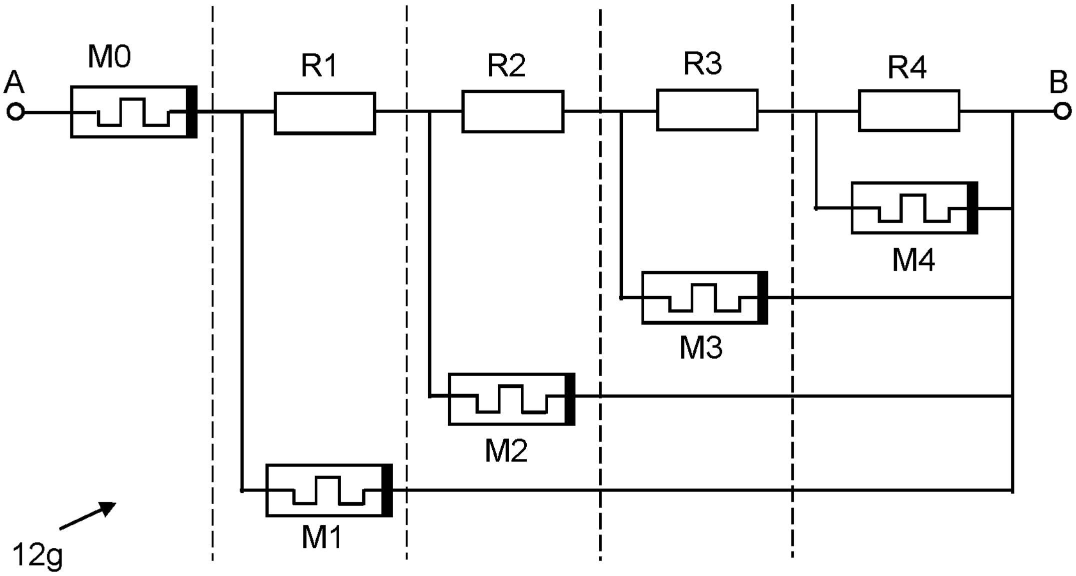

A further example construction of a multi-level memristor element 12 is indicated at 12*g* of FIG. 10*b*. In the embodiment of FIG. 10*b*, the memristor element 12*b* comprises a plurality of binary memristor portions between the input and output terminals A, B, the binary memristor portions demarcated by the broken lines of FIG. 10*b*. In the embodiment of FIG. 10*b*, the first binary memristor portion comprises of a single binary memristor M0 while the subsequent binary memristor portions each comprise a binary memristors M1 to M4 and a respective shunt resistance R1 to R4. In the example of FIG. 10*a* the resistances R1 to R4 of each portion are connected in series with one another, but the respective memristors M1 to M4 of the memristor portions are connected in parallel with more than one of the resistances R1 to R4. This construction provides a nested configuration of the memristors across the shunt resistances. Again it will be appreciated that other arrangements are possible.

In this arrangement it will be understood however that the switching circuitry 14 described above may have a different arrangement to that described with respect to FIG. 3, with the plurality of switches providing connections to either side of the memristors of a binary memristor portion to allow for suitable programming.

Again it will be understood that each binary memristor portion comprises a component in series with components of the other binary memristor portions between the terminals A and B and the binary memristor portions are therefore connected in series. For the second and subsequent portion there is also a connection to another component which is coupled in parallel with the relevant series connected component and possibly one or more of the series connected components of the other binary memristor portions.

In the examples discussed above the multilevel memristor element 12 comprises a plurality of binary memristor portions, each of which can be programmed individually to provide a selectively variable resistance for that portion. As discussed above the binary memristor portions may be configured such that the variation in resistance of the binary memristor portions are scaled with respect to one another in a defined way, for instance with a binary scaling. In the examples discussed above the binary memristor portions are connected in series.

In some embodiments however the multilevel memristor element 12 may comprises a plurality of binary memristor portions connected in parallel with one another, where each binary memristor portion comprises at least one binary memristor and is independently programmable to adopt one of two resistance values for that portion. The binary memristor portions may be scaled so as to provide a desired scaling factor between the parallel connected memristor portions.

Figure 11:
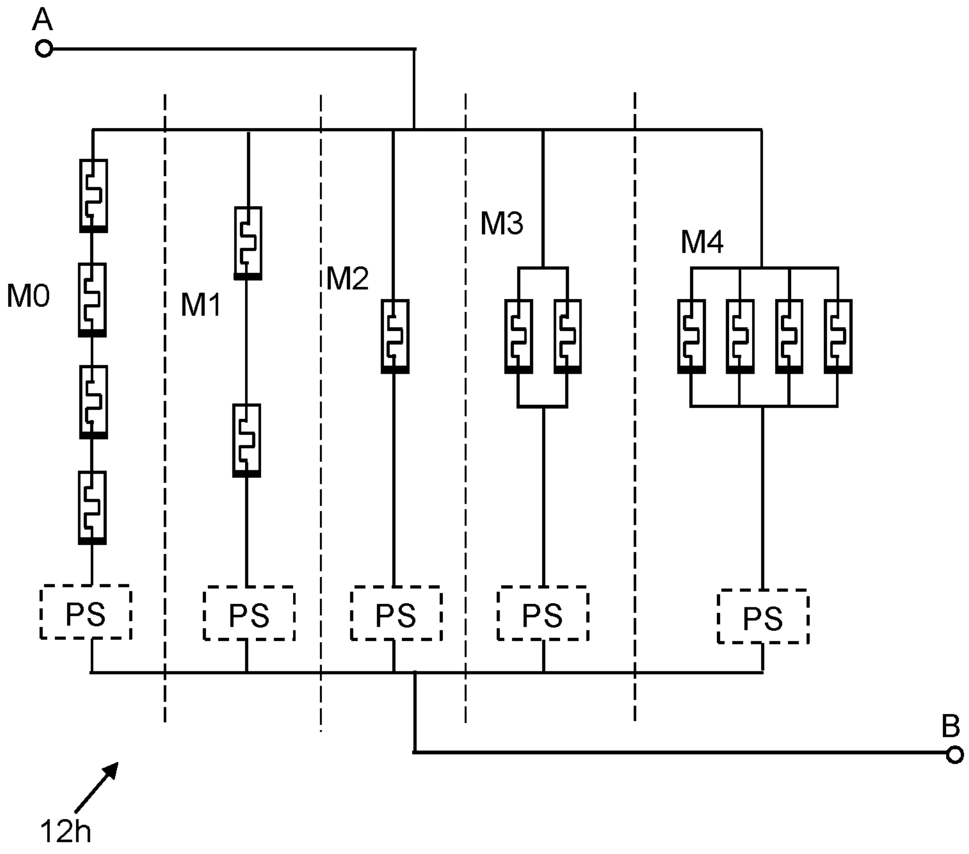
FIG. 11 illustrates a seventh constructions of a multi-level memristor element according to the present disclosure.

A further construction of a multi-level memristor element 12 is indicated at 12*h* of FIG. 11. In the embodiment of FIG. 11, the memristor element 12*h* comprises a plurality of binary memristor portions between the input and output terminals A, B, the binary memristor portions demarcated by the broken lines of FIG. 11. In the embodiment of FIG. 11 however the binary memristor portions are connected in parallel between the terminals A and B.

In a similar manner as discussed above the binary memristor portions may have different configurations to provide different scaled variations in resistance.

In the embodiment of FIG. 11 one binary memristor portion comprises a single binary memristor M2. In this example at least some of the binary memristor portions comprises different number of binary memristors in series. In this example one binary memristor portion comprises two series connected binary memristors M1 and another portion comprises four series connected memristors M1. In use all of the binary memristors of the portion are selectively controlled to the same state HI or LO.

It will therefore be understood that this provides a scaled (delta R) for the different memristor portions. Thus the effective (delta R) for the portion comprising the single memristor M2 will be equivalent to the ΔR of the binary memristor itself. The effective (delta R) for the portion comprising the two series connected memristors M1 will be equal to 2ΔR and the effective (delta R) for the portion comprising the four series connected memristors M0 will be equal to 4ΔR.

In this example at least some of the binary memristor portions comprises a bank of binary memristors in parallel. In this example one binary memristor portion comprises a bank of two parallel binary memristors M3 and another portion comprises a bank of four parallel binary memristors M4. In use all of the binary memristors of the portion are selectively controlled to the same state HI or LO.

This also provide a scaling of the effective (delta R) of the binary memristor portions. It will be appreciated that the effective (delta R) for the portion comprising the bank of two parallel memristors M3 will be equivalent to ΔR/2 of the binary memristor itself. The effective (delta R) for the portion comprising the bank of four parallel memristors M4 will be equal to ΔR/4.

In use the individual binary memristor portions may be individually programmed, by programming all the memristors of that portion to the same of the high state or the low state. If, in use, a defined voltage is applied to the input terminal A the contribution to the current at terminal B for each individual memristor portion will depend on its selected resistance state and the scaling for that portion.

For the purposes of clarity, the detailed switching circuitry used to control the programming of the individual binary memristors 10 is omitted from FIG. 11, but it will be understood that the switching circuitry 14 illustrated in FIG. 3 and the PCM 17 illustrated in FIGS. 4(*a*) and 4(*b*) may be adapted for use in the system of FIG. 11. In some examples however, to program an individual binary memristor portion suitable programming voltages could be applied to the input and output terminals A and B to programme all the memristors of the binary portion to the desired state. To avoid unwanted programming of a binary memristor portion each binary memristor portion may comprise at least one programming switch PS which can isolate that binary memristor portion from at least one of the applied voltages, in which case the programming switch may instead couple the binary memristor portion to an intermediate voltage. To programme the binary memristor portions comprising a plurality of memristor portions a switch arrangement such as discussed with reference to FIG. 3 may be used to apply suitable voltages to each individual memristor of the series connection.

It will be understood that FIG. 11 illustrates just one example and other configurations may be implemented. For instance some binary memristors portions could comprise a shunt resistance in parallel with one or more binary resistors or vice versa. In general any of the variants of a binary memristor portion discussed above may be implemented binary memristor portion in parallel with another binary memristor portion.

In a preferred aspect, the multi-level memristor element 12, 12*a*, 12*b*, 12*c*, 12*d*, 12*e*, 12*f*, 12*g*, 12*h* is used as part of a multiply-and-add circuit. In one aspect, the multi-level memristor element 12, 12*a*, 12*b*, 12*c*, 12*d*, 12*e*, 12*f*, 12*g*, 12*h* is used as part of a synapse circuit for use in artificial neural networks. Description of how a multi-level memristor element may be incorporated into appropriate circuits will now be provided.

Figure 12:
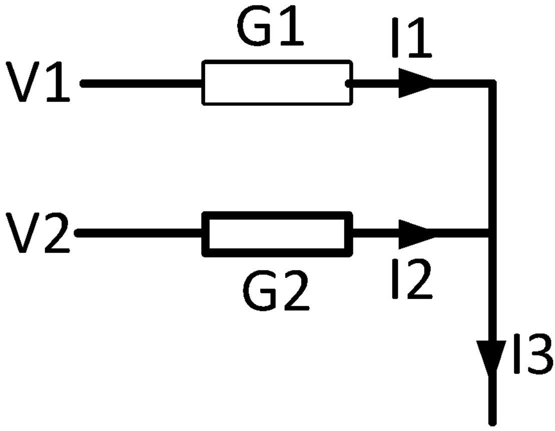
FIG. 12 is an illustration of a known example of a multiply-and-accumulate circuit.

With reference to FIG. 12, the general principle for the incorporation of memristors into a multiply-and-add circuit is illustrated based on Kirchhoff's current law. A pair of input voltages V1 and V2 can be applied across respective signal input paths each having a series resistance G1 and G2 respectively. Based on Ohm's law (V=IR), the resultant current I1 and I2 flowing in the respective paths is based on the voltage divided by the resistance. The paths can then be connected together to provide a total output current I3, which is the sum of currents I1 and I2.

By providing a resistive element where the resistance level can be set by a user, e.g. a memristor, accordingly the circuit as shown in FIG. 12 can be the basis for multiple multiply-and-add operations, wherein resistive weighting values are applied to input voltages to provide weighted output currents.

Figure 13:
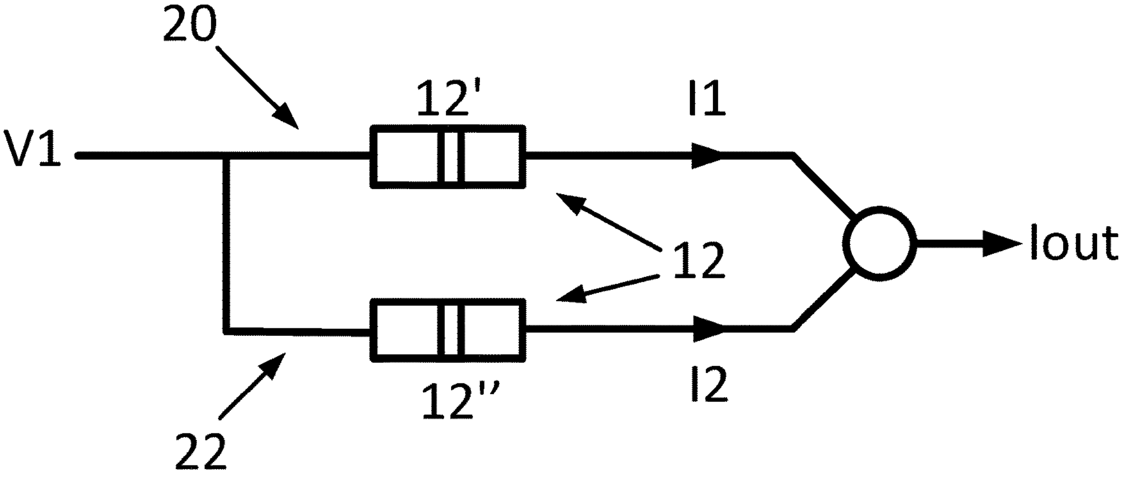
FIG. 13 illustrates a first construction of a synapse circuit using a two-terminal multi-level memristor element according to the present disclosure.

FIG. 13 provides an illustration of a possible configuration of synapse circuit using multi-level memristor elements 12. A first memristor element 12' is provided as part of a first data path 20, wherein an input voltage V1 is applied to the memristor element 12', providing resultant data output current I1.

Ideally memristor element 12' would have 0 ohms impedance in its LO resistance state. In practice, a memristor will have some non-zero resistance level when in the LO resistance state, which will give rise to a data-dependent offset current. To account for such an offset current, a second data path 22 is provided having a second memristor element 12", which provides a second data output current I2. The resultant output current I(out) is based on a combination of the currents I1 and I2, such that any data-dependent offset current is accounted for in the output.

In an example configuration, where the multi-level memristor elements 12', 12" are synthesised from a plurality of binary memristors 10 to implement unary coding, as described above with reference to memristor element 12*a* of FIGS. 3 and 4, the first path 20 is configured such that the resultant data output current I1 has a value coded by Q binary memristors 10 of the memristor element 12' being in the HI resistive state plus the data-dependent offset current.

In the second path 22, all of the binary memristors 10 of the memristor element 12" are set to the LO resistive state, to provide a reference output current I2. As a result, the values of the currents I1 and I2 are determined as follows:

$$I_1 = \frac{V1}{N * R_{LOW} + Q * \Delta R}$$

-continued $$I_2 = \frac{V1}{N * R_{LOW}}$$

Where N is the number of binary memristors of the memristor elements 12', 12"; AR (delta R) is the effective difference in the resistance level of the binary memristors 10 of the memristor elements 12', 12" between the HI and LO resistive states; and R(low) is the resistance level of the binary memristors 10 of the memristor elements 12', 12" when the binary memristors 10 are in the LO resistive state.

Calculating the resultant output current I(out) based on the difference between 11 and 12 gives:

$$I_{out} = I_2 - I_1 = \frac{Q\Delta R}{QN\Delta RR_{LOW} + N^2 R_{LOW}^2}$$

Accordingly, the difference between the currents I1 and I2 provides the information as to the encoding or weighting applied to the input voltage V1, based on the (delta R) of the binary memristors 10 in the first path that are set to the HI resistive state, allowing for I(out) to be representative of the input voltage times a weighting value applied to the multi-level memristor element 12' to control the resistance level of the element 12'.

Figure 14:
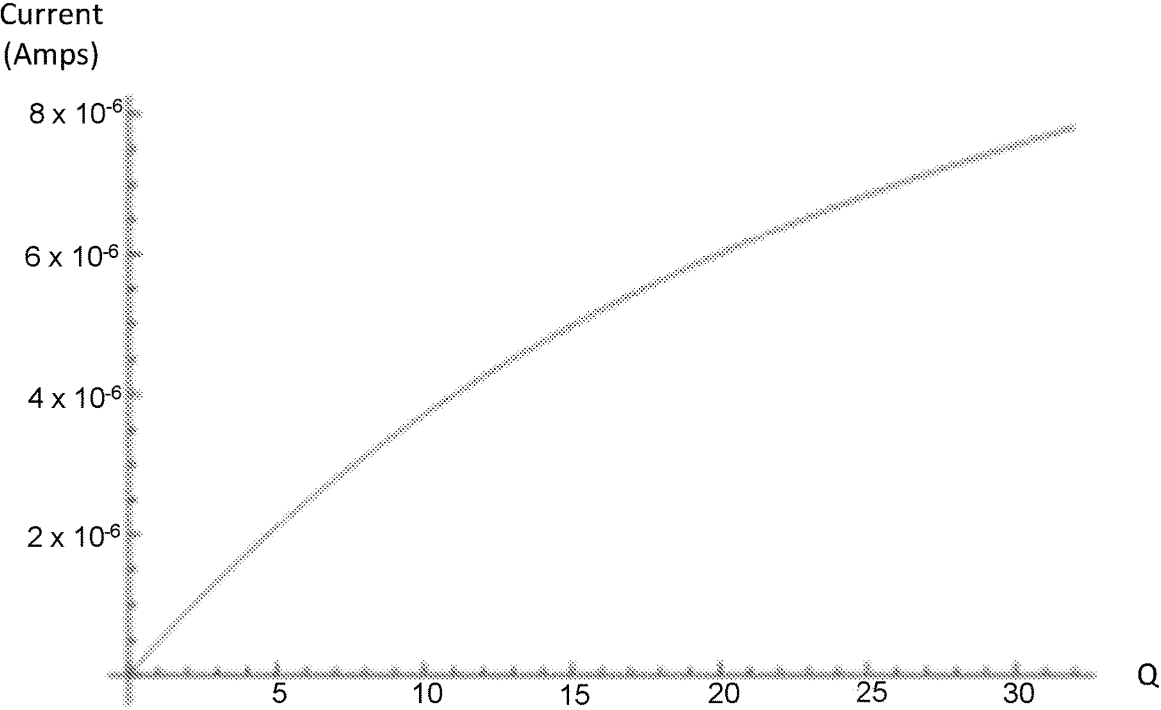
FIG. 14 is a plot of output current against positive bits (Q) of a unary code word for an example implementation of the synapse circuit of FIG. 13.

For an example construction of the configuration of FIG. 13, the relationship between the value of code Q and the current I1 is shown in FIG. 14. As a result, it can be seen that the relationship between code and current is non-linear.

Figure 15:
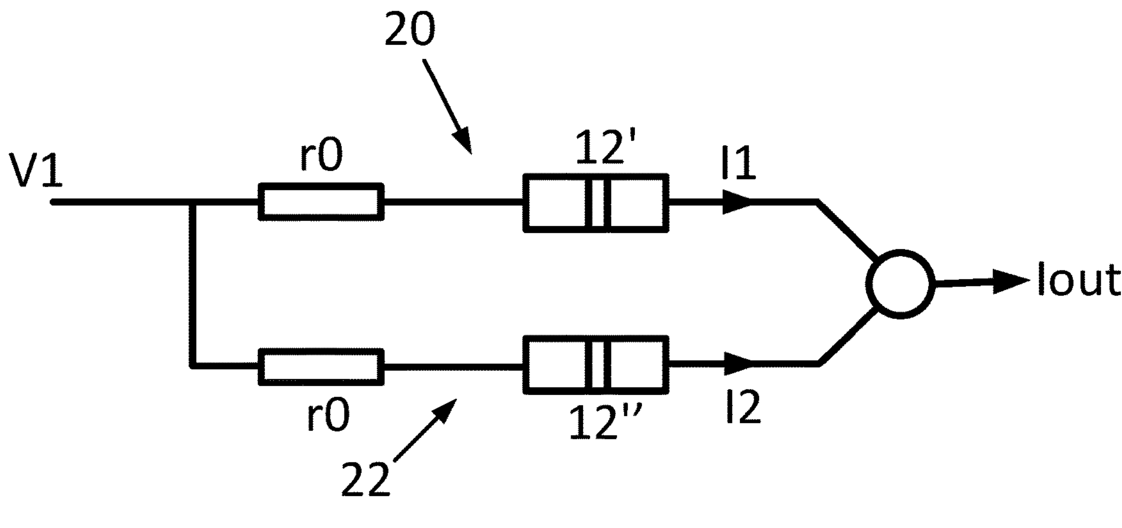
FIG. 15 illustrates a second construction of a synapse circuit using a two-terminal multi-level memristor element according to the present disclosure.

In an effort to linearize the system of FIG. 13, the configuration as shown in FIG. 15 may be used. In FIG. 15, the first and second paths 20, 22 are supplemented by the addition of respective offset resistors R0 in series with the respective memristor elements 12', 12". As a result, the absolute value of the current flowing through the respective data paths 20, 22 can be limited. In this construction, the separate currents in the data paths 20, 22 are calculated as follows:

$$I_1 = \frac{V1}{r0 + N * R_{LOW} + Q * \Delta R}$$

$$I_2 = \frac{V1}{r0 + N * R_{LOW}}$$

Accordingly, the resultant output current is calculated as follows:

$$I_{out} = I_2 - I_1 = \frac{Q * \Delta R}{(r0 + N * R_{LOW})(r0 + Q * \Delta R + N * R_{LOW})}$$

Figure 16:
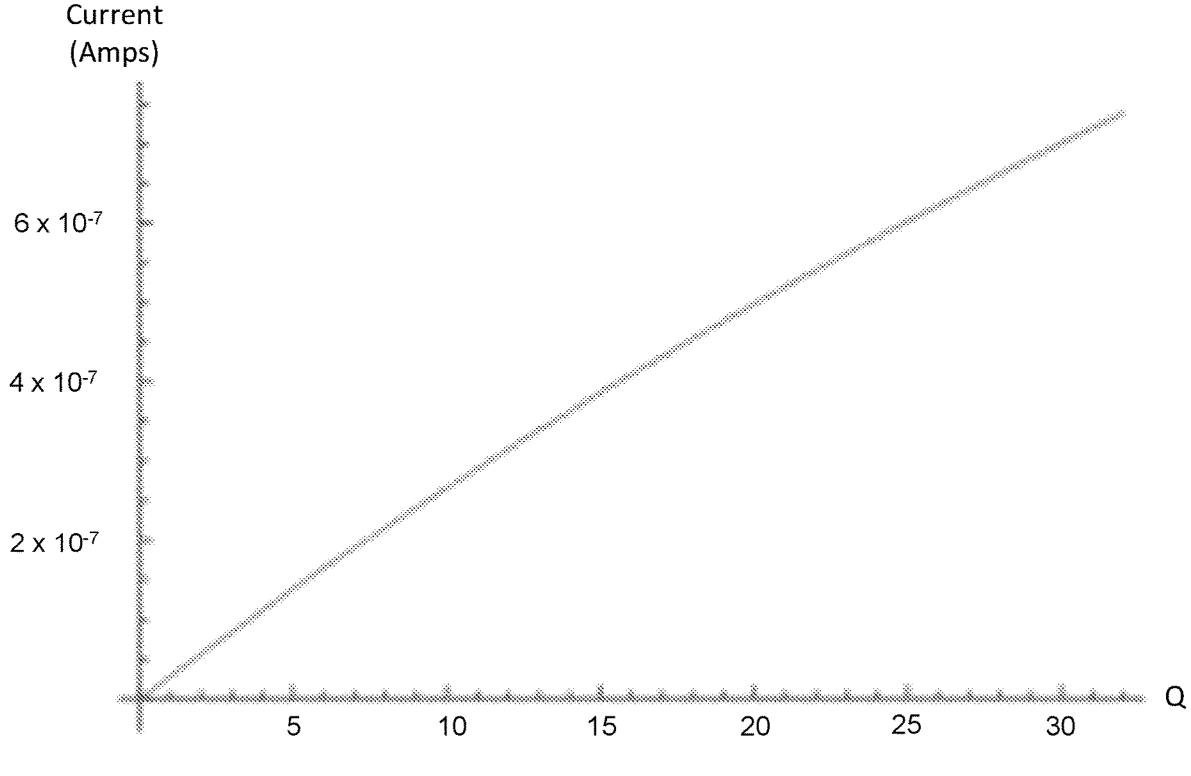
FIG. 16 is a plot of output current against positive bits (Q) of a unary code word for an implementation of the synapse circuit of FIG. 15.

Ideally r0>>N*R(high), where R(high) is the resistance of the memristor element when in the HI resistive state. For an example construction of the configuration of FIG. 15, the relationship between the value of Q and the current I1 is shown in FIG. 16, which can be shown to provide a relatively linear relationship between the value of the code word applied to the memristor element 12' and the output current.

While in the embodiment shown in FIGS. 13 and 15 show an offset resistor r0 is provided in series with the multi-level memristor elements 12', 12" used to implement unary coding, it will be understood that the use of a series-connected offset resistor may equally be used when using memristor elements to implement binary coding. It will further be understood that additionally or alternatively an offset resistance R0 may be incorporated as part of the construction of the multi-level memristor elements 12, 12*a*, 12*b*, 12*c*, 12*d*, 12*e*, 12*f*, 12*g*, 12*h* in series with the binary memristor portions of the respective elements.

A measure of the efficiency u of the above construction can be determined by comparing the differential signal to the common mode signal:

$$\mu = \frac{I_2 - I_1}{I_2 + I_1} = \frac{Q\Delta R}{2r0 + Q\Delta R + 2NR_{LOW}}$$

While the above embodiments of synapse circuit describe the binary memristors of the second memristor element 12" as being set at the LO resistance state to define a reference current for use in the determination of the output current, it will be understood that the second memristor element 12" may be set at any suitable offset value, e.g. where the binary memristors of the second memristor element 12" are all set at the HI resistance state, or the memristors are set a combination of HI and LO states at a pre-defined resistance state between fully HI and fully LO.

Figure 17:
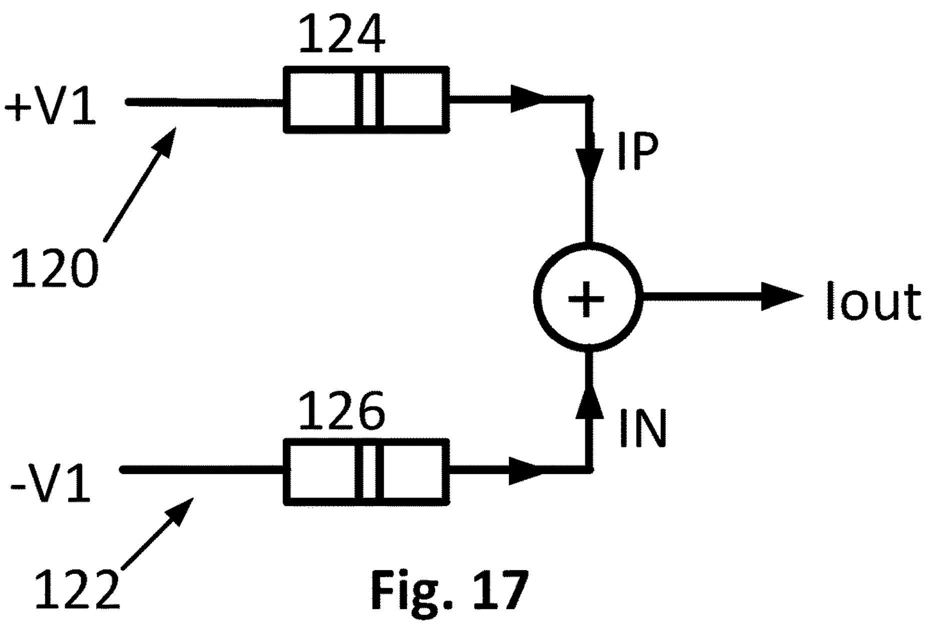
FIG. 17 illustrates a third construction of a synapse circuit using a two-terminal multi-level memristor element according to the present disclosure.

In a further aspect, the synapse circuit may be provided as a differential system, wherein data is applied through both the first and second paths of the synapse circuit, with the resistance level of the memristor elements in both paths varied accordingly. For example, the synapse circuit may be configured as shown in FIG. 17, where a positive data input voltage (+V1) is applied to a first path 120, while a negative data input voltage (−V1) is applied to a second path 122. In this case, the weighting applied through memristor elements 124 and 126 is coded to reflect the positive and negative aspects of the input signals.

In this configuration, we have:

$$IN = \frac{-V1}{N * R_{LOW} + \left(\frac{N}{2} + K\right) * \Delta R}$$

$$IP = \frac{V1}{N * R_{LOW} - \left(\frac{N}{2} - K\right) * \Delta R}$$

Where K is the input code defining the memristive element state, and where the output current can be defined as follows:

$$Iout = \frac{4NV1\Delta R}{(2K\Delta R - N\Delta R + 2NR_{LOW})((2K + N)\Delta R + 2NR_{LOW})}$$

This may be linearized with the addition of appropriate offset resistors r0 as described above. If offset resistors r0 are used, the output current can be calculated as follows:

$$Iout = \frac{4NV1\Delta R}{(2R0 + 2K\Delta R - N\Delta R + 2NR_{LOW})(2R0 + (2K + N)\Delta R + 2NR_{LOW})}$$

Applying the measure of the efficiency of this differential construction gives the following:

$$\mu = \frac{I_P - I_N}{I_P + I_N} = \frac{2(R0 + K\Delta R + NR_{LOW})}{N\Delta R}$$

Accordingly, the differential construction may be more efficient than the single-ended reference system described above with reference to FIG. 15.

Figure 18:
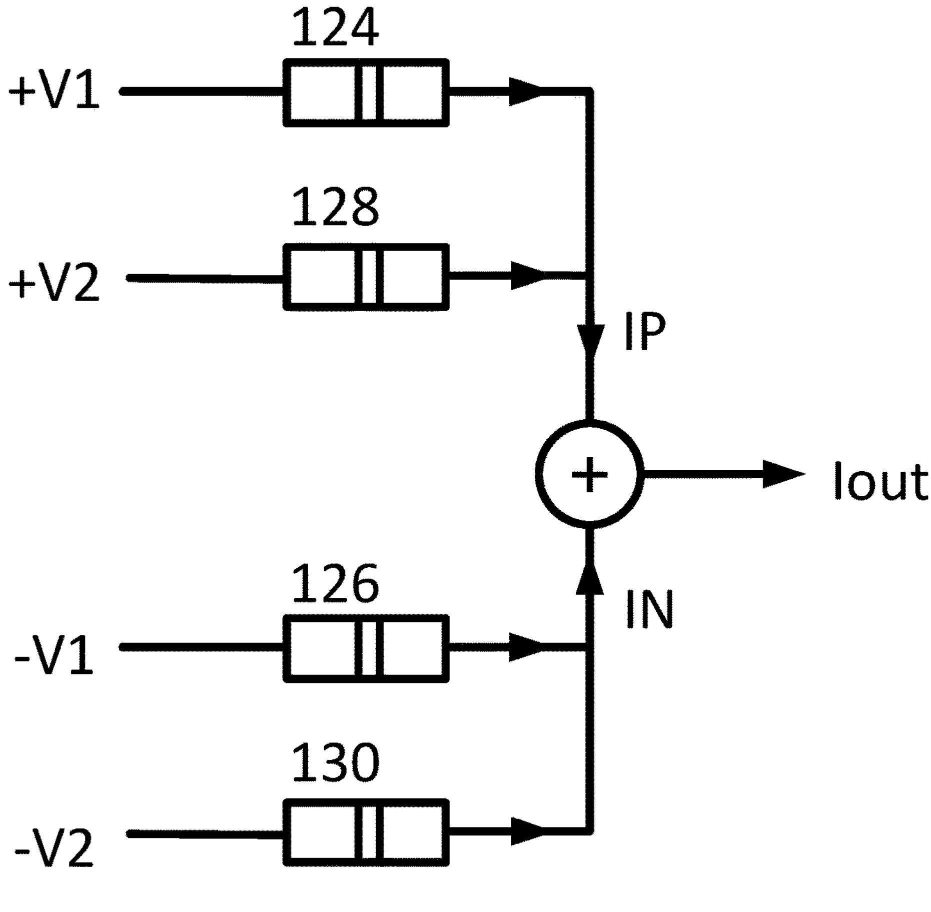
FIG. 18 illustrates a construction of a multiple-synapse circuit using a two-terminal multi-level memristor element according to the present disclosure.

While the above embodiments of synapse circuit act to apply a weighting to a single input voltage, it will be understood that multiple-synapse configurations may be used to perform a multiply-and-add operation on two or more separate input voltages. An example of such a multiple synapse cell is illustrated in FIG. 18, where two input voltages V1 and V2 are applied in a differential manner via respective positive and negative data paths comprising memristor elements 124, 126,128, 130. The resultant currents from the positive and negative paths IP and IN are then used to provide the resultant output current I(out) as described above.

Figure 19:
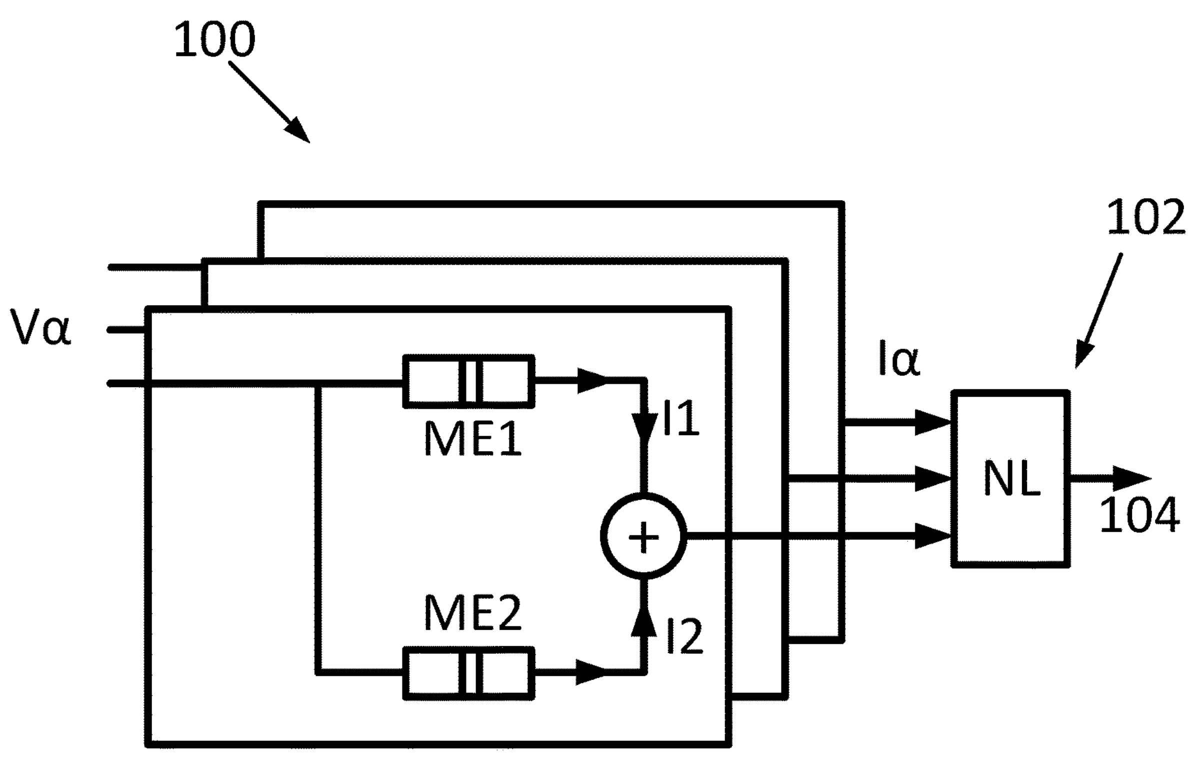
FIG. 19 illustrates a construction of a neuron circuit comprising a synapse circuit using a two-terminal multi-level memristor element according to the present disclosure.

In FIG. 19, a variation of neuron circuit is indicated at 100, wherein multiple single-ended configurations of synapse circuits are used for a multiply-and-add operation on multiple input voltages (as indicated by V(alpha)) to provide multiple parallel resultant output currents (as indicated by I(alpha)). The output currents I(alpha) are provided as inputs to a non-linearity module 102 to provide a single output signal 104, which may be used as an output of a neural network and/or as an input to other neuron circuits.

In this configuration, the individual memristor elements ME1, ME2 of the first and second data paths are coded to account for the single-ended approach.

Figure 20:
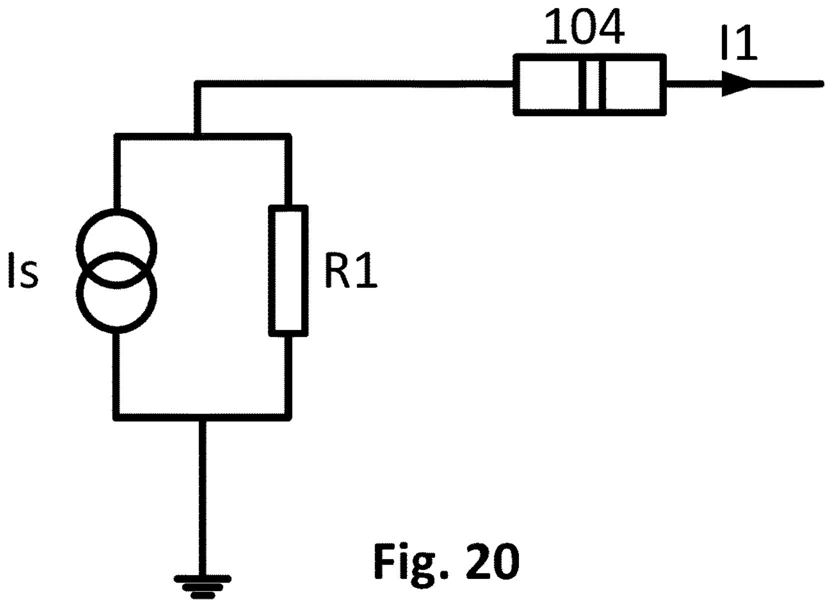
FIG. 20 illustrates a variation of a circuit using a two-terminal multi-level memristor element according to the present disclosure having a current-mode input source.

While the embodiments of synapse circuit above are described as receiving an input voltage, it will be understood that the data input signal may be provided as a current source input signal. With reference to FIG. 20, an input voltage for an example synapse circuit may have a Norton equivalent current source Is which is provided with a shunt resistance R1. The output of the current source Is is varied to achieve the desired input to the memristor element 104 of the synapse circuit.

In some embodiments, the shunt resistance R1 may be replaced with the first binary memristor portion of the memristor element 104, e.g. with shunt resistance R1 replaced by the binary memristor M0 as shown in FIG. 5, 6, 8, 9, 10*a* or 10*b*.

In a further aspect of the present disclosure, the reference resistance path, for example as described with reference to FIG. 12 above, may be replaced or adjusted to account for different use cases. For example, FIGS. 20-22 illustrate different configurations of circuits when multiple synapse circuits are combined to provide multiple multiply-and-add operations.

Figure 21:
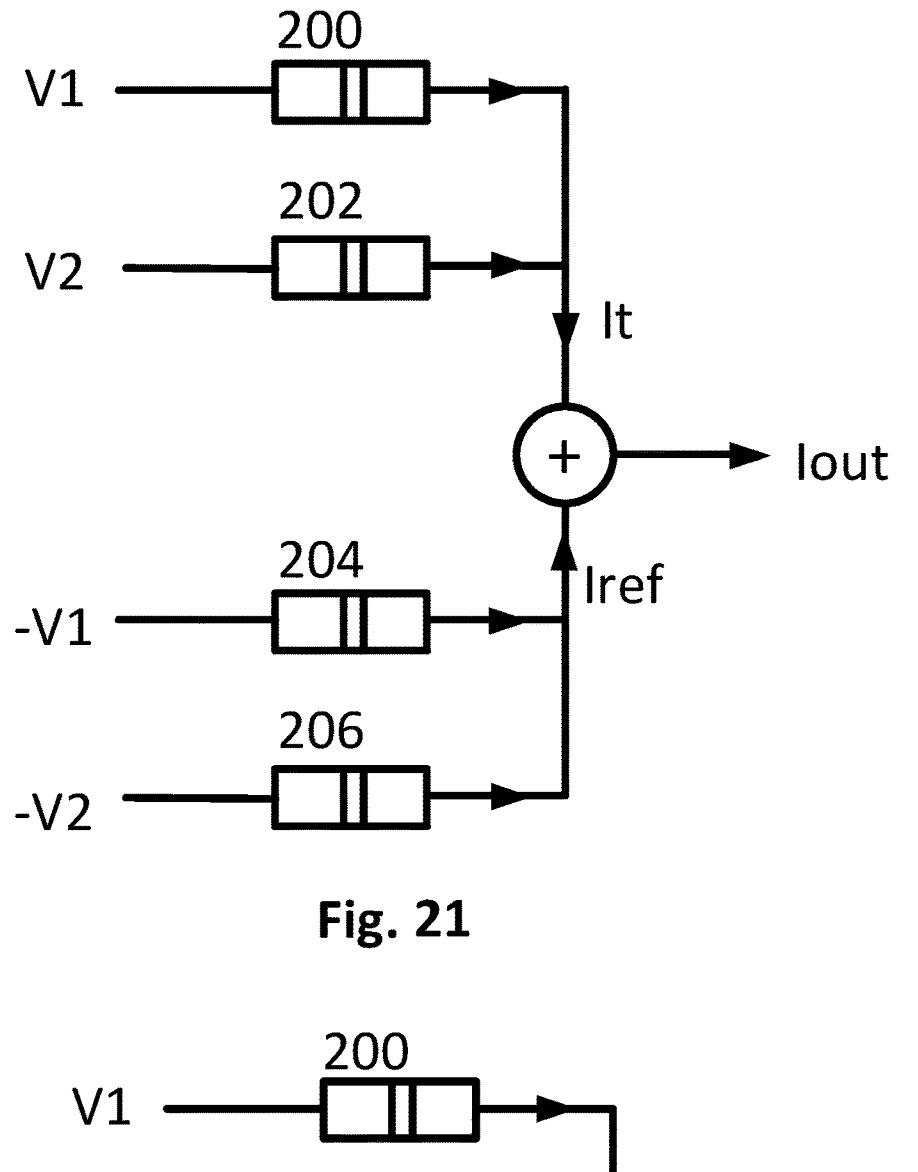
FIG. 21 illustrates a construction of a multiple-synapse circuit having a first configuration of reference path.

In FIG. 21, input voltages V1 and V2 are applied to separate data paths having respective memristor elements 200 and 202, with the subsequent output currents summed to provide current I(t). Separately, the inverse of the input voltages −V1 and −V2 are applied to separate reference paths having respective memristor elements 204, 206 programmed to a reference resistance value, with the subsequent output currents summed to provide current I(ref). Accordingly, the currents I(t) and I(ref) are added to provide the output current I(out) which is compensated for the offset current present in the system due to the memristor construction.

Figure 22:
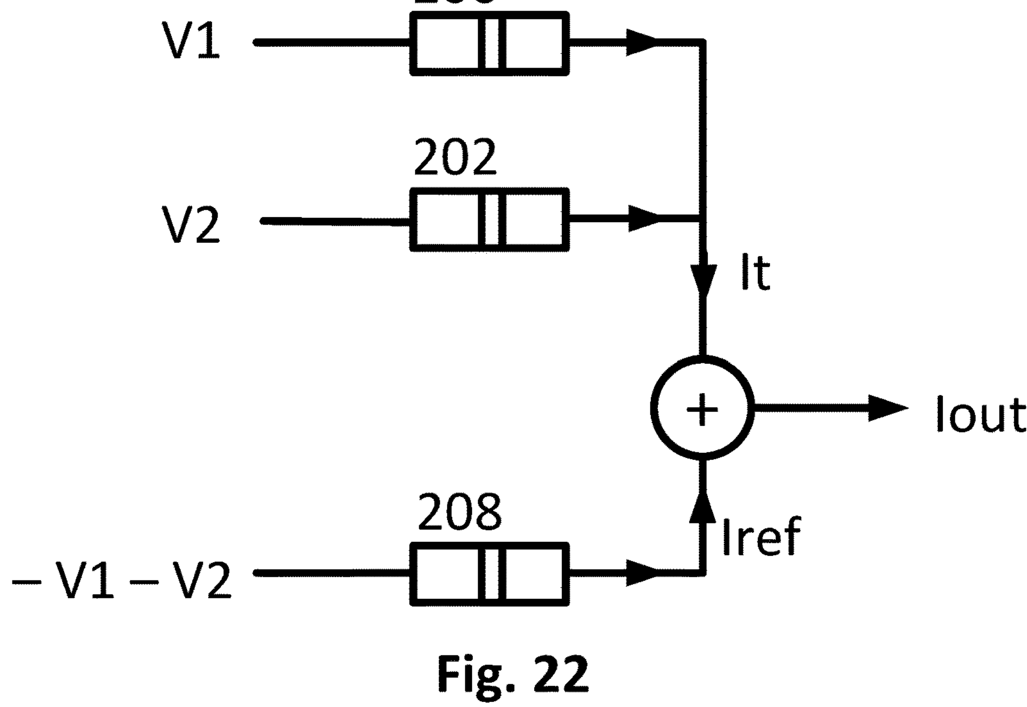
FIG. 22 illustrates a construction of a multiple-synapse circuit having a second configuration of reference path.

In an alternative configuration, in FIG. 22 the separate memristor elements 204, 206 of the reference paths of FIG.

21 are replaced by a single reference path having a single reference memristor element 208, where the inverse of the input voltages −V1 and −V2 are summed and applied to the reference path to provide the subsequent reference current I(ref). The value of reference memristor element 208 in this embodiment is selected to provide the same I(ref) as the circuit of FIG. 21, i.e. the resistance level of reference memristor element 208 is set to the reference resistance value.

Figure 23:
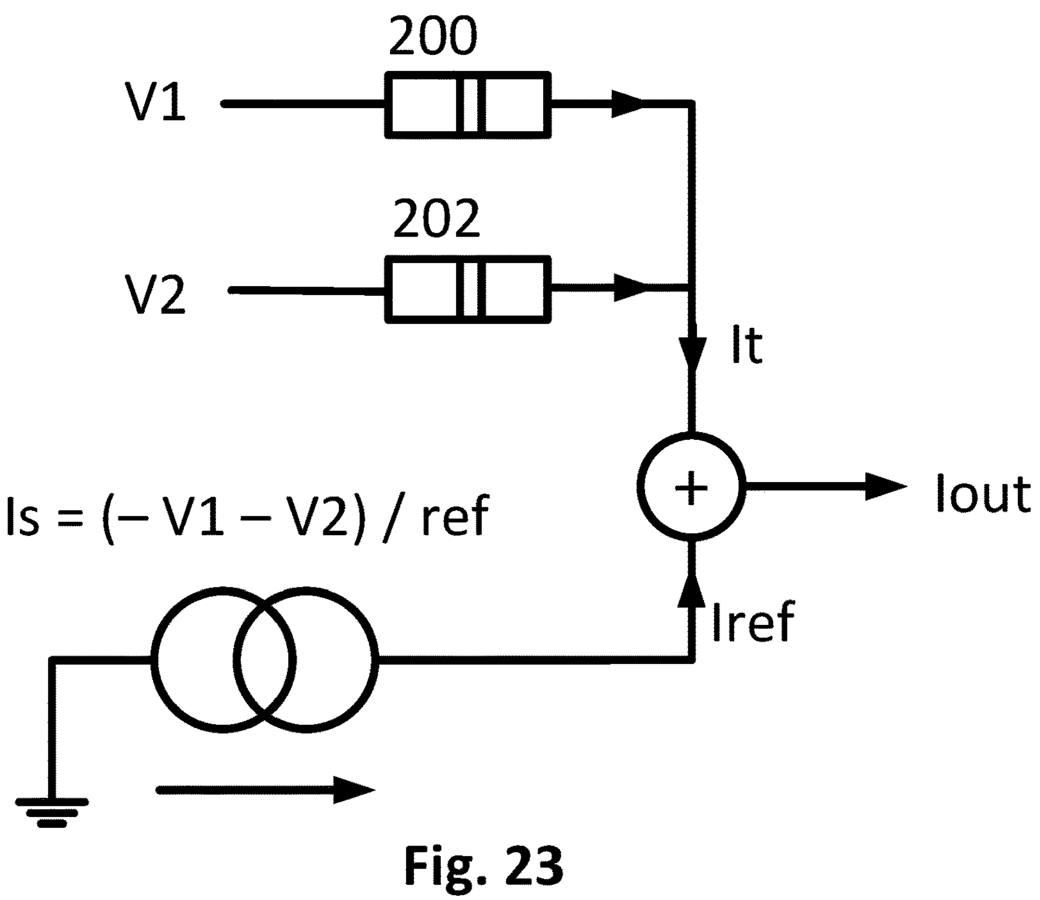
FIG. 23 illustrates a construction of a multiple-synapse circuit having a third configuration of reference path.

In a further alternative configuration, in FIG. 23 the reference path with a reference memristor element is replaced with a single current source Is, wherein Is is configured to provide a reference current equivalent to the reference current of the other embodiments, i.e., the current source Is outputs a reference current such that:

$$Is = \frac{(-V1 - V2)}{Rref} = Iref$$

Where Rref is the reference resistance value.

It will be understood that other configurations of synapse circuit or neuron circuit may be provided. In a further aspect, it will be understood that the input voltage for the synapse circuit may be provided as a continuously-varying voltage level. Additionally or alternatively, the input voltage for the synapse circuit may be provided as a bi-level data signal, e.g. from a PWM or Sigma Delta data stream.

In a further aspect of the present disclosure, the program control module PCM 17 may be configured to perform an intermediate mapping of the received input code or weighting w to the eventual programming scheme used for the memristor element, to provide for a desired operation of the memristor element.

In general, a linear change in the number of binary memristor portions of a memristor element that are programmed to the HI or LO resistance state may translate into a linear change in total resistance. However, depending on the circuit, a linear change in resistance may not translate into a linear change in conductance.

Figure 24:
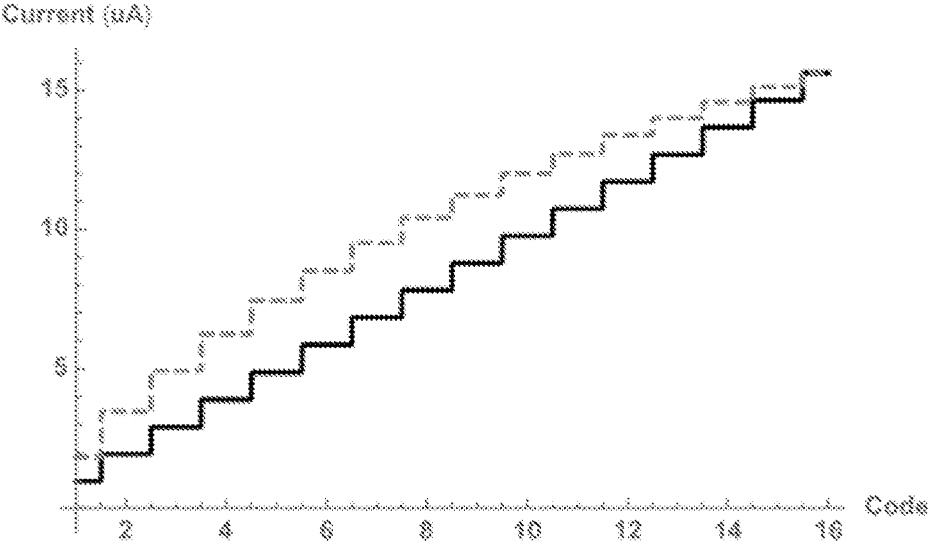
FIG. 24 illustrates a plot of received input code vs. current through a two-terminal multi-level memristor element according to the present disclosure, for a linear variation in element resistance.

For example, FIG. 24 illustrates a sample plot of current vs. input code or weighting w through a multi-level memristor element, for a unary code to implement weighting values between 1-16. It will be understood that the current is directly proportional to the conductance of the memristor element, which is in part defined by the number of binary memristor portions of the memristor element that are programmed to the HI or LO resistive states. For a linear unary coding, each successive bit indicates that an additional binary memristor portion of the memristor element is switched between the resistive states.

The solid line of FIG. 24 indicates an ideal code-to-current system, wherein each increase in the input code translates to an equal step change of approximately 1 uA of current, providing a linear relationship between code and output current (or conductance). However, due to the system configuration, the conductance of the memristor element scales non-linearly with a linear increase in input code, resulting in the relationship between code and output current illustrated by the broken line of FIG. 24.

In a preferred embodiment, the program control module of the memristor elements of the present disclosure, as illustrated at PCM 17 in FIGS. 4(*a*) and 4(*b*), is configured to perform an intermediate mapping of the input code or weighting w to the actual programmed codes of the memristor element, to provide for a linear variation in device conductance based on the received input code. With reference to the table of FIG. 25, the variation in received input code directly translates into a linear change in the total resistance of the memristor element, but a non-linear translation is required to provide a linear change in conductance.

Figures 25, 26:
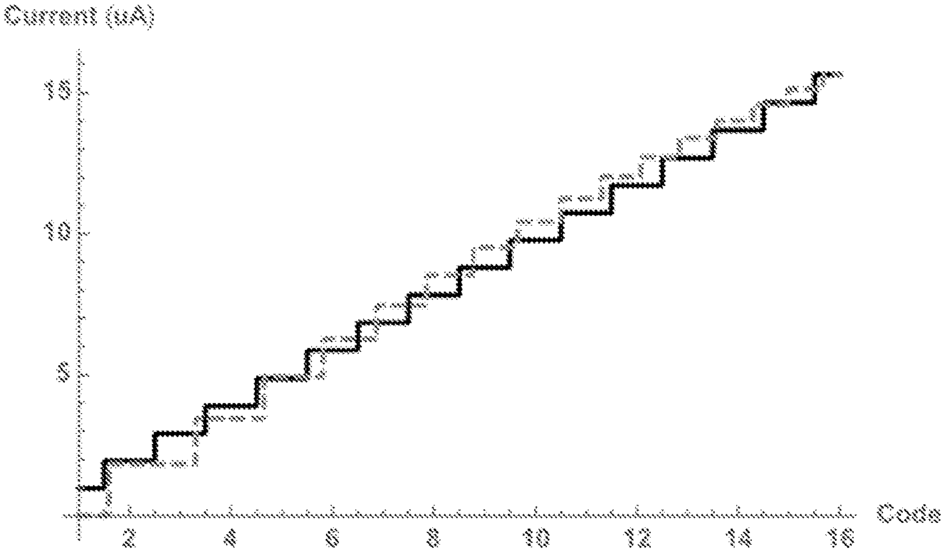
FIG. 25 illustrates a table for the mapping of received input codes vs. programmed portions of a 4-bit memristor element for a linear variation in element resistance, and a linear variation in element conductance.
FIG. 26 illustrates a plot of received input code vs. current through a two-terminal multi-level memristor element according to the present disclosure, for a linear variation in element conductance.

The first column of FIG. 25 shows the input code or weighting w received by the PCM 17. The second column illustrated the programming performed to provide a linear variation in resistance of the memristor element—for example, for input code 1, only one binary memristor portion is switched to a HI resistive state, while for input code 16 then accordingly 16 binary memristor portions are switched to the HI resistive state. The third column illustrates the programming performed to provide an approximate linear change in conductance—for example, for input code 1, no binary memristor portions switched to the HI resistive state, while for input code 10 accordingly 8 binary memristor portions are switched to the HI resistive state.

With reference to FIG. 26, such a non-linear mapping provides a curve fitting of the current-to-code relationship, when compared with the ideal code-to-current system. As with FIG. 24, the solid line of FIG. 26 indicates an ideal code-to-current system, wherein each increase in the input code translates to an equal step change of approximately 1 uA of current, while the broken line of FIG. 26 indicates the code-to-current relationship for a memristor element where the code inputs are mapped to different assignments of binary memristor portions to provide an approximately linear variation of element conductance with input code.

While the above description provides for a correction or mapping of the received input codes to provide for a linear variation in conductance of the memristor element, it will be understood that other mapping configurations may be applied by the PCM 17, depending on the system use-case and desired performance.

As discussed above a multi-level memristor element 12 such as described in any of the variants herein may be advantageously used in a neuromorphic computing circuit, for instance as part of an artificial neural network (ANN), e.g. as a synapse circuit. A multi-level memristor element according to any of the variants described herein may, however, be usefully employed in other applications, and may be useful in any application where it may be desirable to be able to program an element of a circuit to any of a number of different resistance values that may persist in the absence of applied power.

Embodiments thus also relate to multi-level memristors implemented in other circuitry, e.g. general purpose circuitry. For instance, multi-level memristors such as any of the multi-level memristors elements 12*a*, 12*b*, 12*c*, 12*d*, 12*e*, 12*f*, 12*g*, 12*h* described above may, in one example be used to implement a programmable gain.

Figure 27:
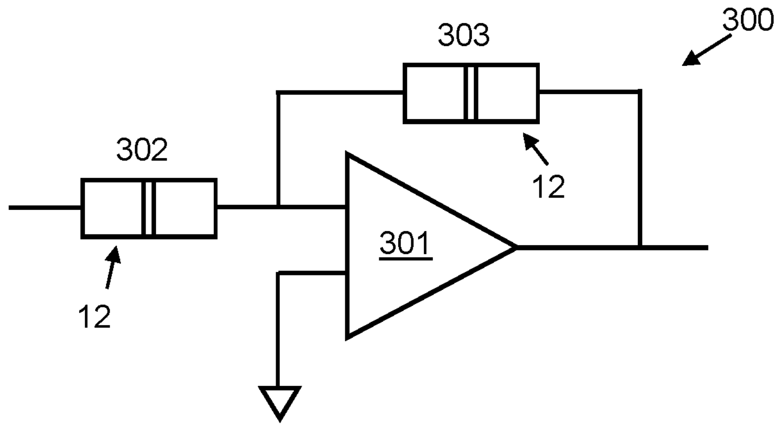
FIG. 27 illustrates a construction of an amplifier circuit using multi-level memristor elements according to the present disclosure.

FIG. 27 illustrates an example of amplifier circuitry 300 comprising an amplifier 301. In this example an input signal may be applied to the amplifier 301 via an input resistance 302. There may also be a feedback resistance 303. At least one of the input resistance 302 and the feedback resistance 303 may be implemented by a multi-level memristor element 12 as discussed in any of the variants herein. In the example of FIG. 27 each of the input resistance 302 and the feedback resistance 303 are implemented as multi-level memristor elements 12. In this case the value of the input resistance 302 and the feedback resistance 303 may be selectively programmed to provide a desired gain. Once programmed the memristors elements will maintain the resistance values, and hence the selected gain level, until reprogrammed. This may conveniently allow the gain of the amplifier to be selectively varied between a plurality of different gain values, but maintaining a selected gain value may not require any power to be applied to control the input resistance 302 or feedback resistance 303. It will be understood that other arrangements are possible and there may be one or more fixed resistance in some combination. It will also be understood that FIG. 27 shows a single-ended configuration but the same principles could be applied to differential amplifiers.

FIG. 27 illustrates just one example of use of a multi-level memristor element. Other applications could include use in a trimming circuit, to trim some signal of interest, e.g. adjustment of a signal of interest so as to adjust operation of a circuit to provide standardised operation. A multi-level memristors may allow a selected value to be programmed to provide a certain degree of trimming, but the use of a multi-level memristor may allow subsequent re-programming to adjust the degree of trimming. A multi-level memristor may be used as part of a programmable filter circuit, or voltage controlled oscillator or any other circuit where a programmable resistance may be advantageous.

The discussion above has focused on the use of binary memristors. As used herein the term memristor may refer to an electronic element that has a variable resistance which can be varied and which has some memory such that a particular resistance state persists in the absence of applied power. Binary memristors have been proposed, for instance based on MRAM (Magnetoresistive random-access memory) or ReRAM (Resistive random-access memory) memory, that can exhibit either a high resistance state or a low resistance state and can be selectively programmed to operate in the desired state, for instance by applying suitable programming voltages. An individual MRAM or ReRAM memory or memristor may thus be used as binary memristor and can be seen as a type of programmable memory.

However there may be other types of programmable-resistance memory component that may be programmable can be selectively controlled to adopt one of two different states, where each state exhibits a different resistance or conductance, and the selected state persists once programmed. For instance programmable-resistance memory components could comprise or be based on flash-based memory e.g. floating-gate technologies such as ESF3, charge-trap technologies such as Silicon-Oxide-Nitride-Oxide-Silicon technologies (SONOS), fuses (polysilicon or metal), carbon nanotubes or some non-memristive MRAM technologies such as spintronic technology, or phase-change memory such as chalcogenic glass. In general, any suitable programmable-resistance memory component could be used as a binary memory component in place of at least some of the binary memristors described in the various embodiments.

In particular, charge-trapping-transistors (CTTs) may be used as a programmable-resistance memory component in some embodiments of the disclosure. CTTs are known semiconductor devices which can be used to store charge. However, unlike a conventional floating-gate transistor, where charge is stored in the conductive floating gate, in a CTT the charge is stored in an insulating charge-trapping layer.

Figure 28:
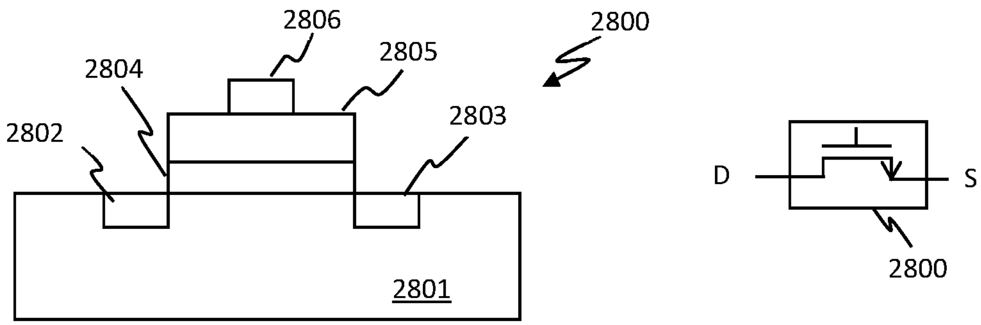
FIG. 28 illustrates an example of a charge-trapping transistor.

FIG. 28 illustrates, on the left-hand side, the basic structure of one simplified example of CTT 2800 and illustrates, on the right-hand side, a circuit symbol for a CTT as will be used in this disclosure.

The CTT 2800 comprises a substrate 2801, typically silicon, with drain and source regions 2802 and 2803. An insulating layer 2805 is formed over the channel region of the substrate 2801 with a charge-trap layer 2805 and control gate 2806 on top. For some examples of CTTs, silicon dioxide has been used as the insulating layer, with silicon nitride being used for the charge-trap layer, although other material systems may be used.

CTTs of this type, including a layer which is specifically provided for charge trapping, have been implemented as CTT devices for storing charge and such CTTs have, for example, been proposed for use in flash memory or the like.

For some semiconductor production processes, for instance for smaller process nodes, such as a process node of 22 nm or smaller, the fabrication of a floating-gate transistor device may utilise a layer of high-k dielectric material, e.g. as part of a gate stack, and in such devices, the high-k dielectric material may operate as a charge trapping layer. For some other applications, the charge trapping effect of the high-k dielectric material may be undesirable, but such devices can advantageously be used as CTTs.

CTTs may be implemented as N-channel or P-channel devices, e.g. as NMOS or PMOS transistors, and CTTs of either type may be used in embodiments of this disclosure, although in some applications NMOS device may be preferred as NMOS device may typically be implemented with a smaller circuit area footprint than PMOS devices.

The basic principle of operation of a CTT is the trapping and release of electrons or holes in the charge trap layer 2805. Applying a suitable voltage to the control gate 2806, sometimes together with a voltage applied being between the drain and source 2802 and 2803, creates an electric field that can allow the charge carriers to tunnel through the insulating layer 2804 to the charge trap layer 2805 where they become trapped. This trapped charge alters the threshold voltage $V_T$ of the transistor. Different voltages can be specifically applied to the control gate to cause release or de-trapping of the charges, but in the absence of such specific release voltages being applied, the time constant for spontaneous release of the trapped charge can be high, for example of the order of years for some implementations, allowing the storage of data by means of the trapped charge and the resultant effect on the threshold voltage of the CTT.

Assuming the CTT is biased into the linear region, e.g. with a gate source voltage above the threshold voltage $V_T$ and a relatively small drain source voltage $V_{DS}$, the drain-source resistance $R_{DS}$ can be given by:

$$R_{DS} = \frac{1}{k\frac{W}{L}(V_{GS} - V_T)}$$

where k is the Boltzmann constant and W and L are width and length of the channel of the transistor respectively.

Thus, the drain-source resistance $R_{DS}$, which can be seen as the 'on-resistance' of the transistor, can effectively be programmed by controlling the amount of charge trapped by the CTT and hence the CTT can be used as a programmable resistance memory element. In some applications, the on-resistance $R_{DS}$ (for a given gate-source voltage $V_{GS}$) could be programmed to any value within an operating range in an analog or continuous fashion, however, a more robust approach is to shift the threshold voltage $V_T$ by a substantially fixed and repeatable amount, e.g. to set the threshold voltage to either of a defined first value $V_{T1}$ and a defined second, different, value $V_{T2}$, and thus set the resistance $R_{DS}$ to either of two corresponding specific values $R_{DS1}$ or $R_{DS2}$ (for a fixed gate-source voltage Vas). The CTT can thus be operated as a binary programmable resistance memory element, and a multi-bit programmable resistance element can be synthesised from a plurality of such CTT binary programmable resistance memory elements, although in some applications the CTT could be selectively programmed to a number of discrete resistance states that is greater than two, e.g. to set the threshold voltage $V_T$ to a selected one of N different possible values $V_{T1}$, $V_{T2}$, . . . $V_{TN}$.

The use of CTTs can offer some advantages compared to memristors. The CTTs can be formed using standard semiconductor fabrication techniques. Some processes for production of memristors involve dedicated processing to form the memristor that may require additional and/or non-standard circuit layers, which can add to the costs of manufacture, whereas formation of a CTT may be achieved using the standard processing steps used to form the rest of the circuit.

Additionally, as will be noted from the equation for $R_{DS}$ above, the variation in on-resistance is inversely proportional to $V_{GS}$-$V_T$ and thus the controlled variation in threshold voltage $V_T$ leads to a linear change in conductance, which can be beneficial for the application to analogue computing and the use of CTTs for storing weighing values. In analog computing it may be beneficial for the variation in conductance of the multi-level programmable element, which would generally require the variation in resistance to be hyperbolic.

A multi-level memory element or cell could be formed in a similar fashion as discussed above with respect to the binary memristors, with CTTs being implemented to provide the functionality of at least some of the binary memristors. Thus, for example, a multi-level, e.g. multi-bit digital, programmable resistance memory cell may be formed as described with reference to any of FIG. 3, 5, 6 or 8-11, with at least some or all of the memristor elements being implemented by CTTs, with some consequential changes to the programming circuitry as will be discussed in more detail below. Thus, for example, a multi-level programmable resistance cell could be implemented as illustrated in FIG. 5, with a series arrangement of binary portions where each binary portion comprise a CTT and for at least some of the binary portions, the CTT is in parallel with a fixed resistance and the values of the fixed resistance differ in the different binary portions to provide a desired variability in resistance for that binary portion. In other words, the CTTs may be arranged to provide weighted bit portions of the multi-level memory cell, such that programming the relevant CTTs of the bit portion programmes a bit of the multi-level memory cell and provides a weighted variation in the overall on-resistance of the memory cell.

From the equation for the resistance $R_{DS}$ of a CTT it will be noted that the on-resistance of the CTT has a dependence on the gate-source voltage Vas applied to the CTT in use. Thus the gate-source voltage Vas should be controlled to a known value, in use for data output from the memory cell. In at least some examples, it may be advantageous in terms of simplicity and/or consistency to use the same value of gate-source voltage Vas for a set of at least some, and possibly all, of the CTTs during data output. For an arrangement of series connected CTTs, such as illustrated in FIG. 5, providing a specific defined gate-source voltage for each CTT would involve monitoring the relevant source voltage along the series connection and providing some feedback control to adjust the gate voltage accordingly. Such an arrangement, whilst possible, could involve some relatively significant complexity.

In at least some implementations, it may therefore be preferable for a set of at least some, and possibly all, of the CTTs to be connected in a manner such that the source of the relevant CTT is connected to a defined reference voltage. In this way, the gate voltage for the relevant CTT can be set with respect to the defined reference voltage. Advantageously, to reduce the number of reference voltages required, the multi-level programmable resistance cell may be configured such that a plurality of CTTs have a common source terminal, i.e. a set of at least some, and possibly all, of the CTTs are arranged so that their source terminals connect to a common source node that can be at a defined reference voltage.

Figure 29:
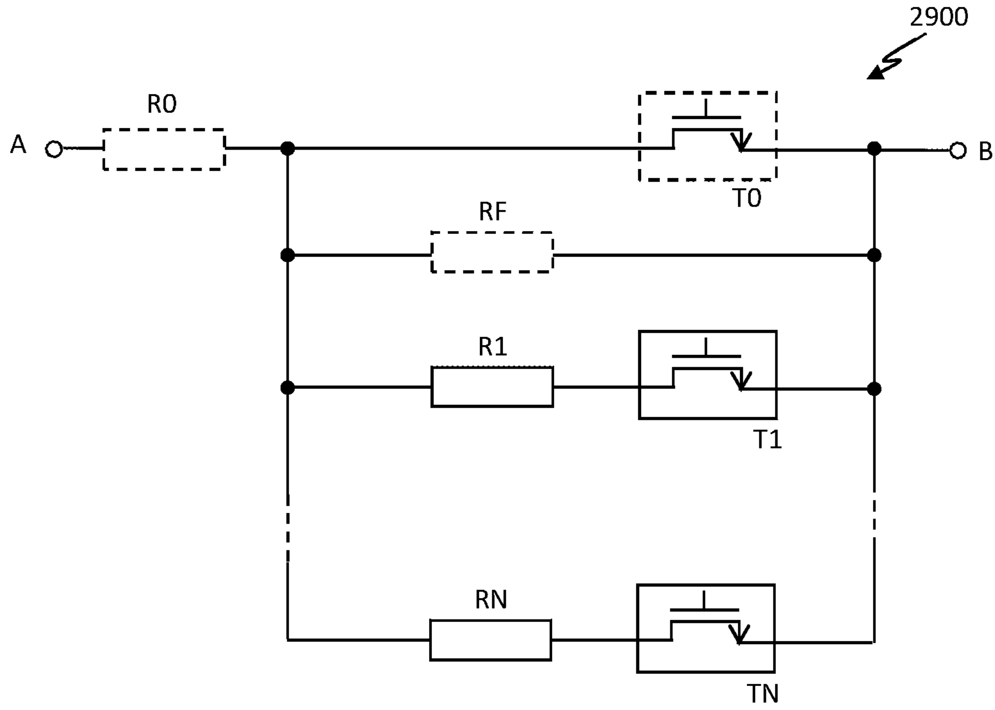
FIG. 29 illustrates one example of a multi-level programmable resistance memory cell formed from a plurality of charge-trapping transistors having a common source node.

FIG. 29 illustrates one example of a multi-level programmable resistance cell 2900 formed from CTTs according to an embodiment. FIG. 29 illustrates that the multi-level programmable resistance cell 2900 extends between two terminals, A and B, and comprises a plurality of parallel branches. In this example, a first branch comprises a first CTT TO, a second branch comprises a fixed resistance RF and each subsequent branch comprises a resistance R1 . . . RN in series with a respective CTT T1 . . . TN.

A common resistance R0 is connected in series with the parallel branches, although in some examples this common resistance may be omitted. Likewise, in some examples the parallel branch with only a fixed resistance, i.e. the resistance RF as illustrated, may be omitted and/or each branch may comprise a resistance in series with a CTT, i.e. the branch with CTT T0 on its own could be omitted.

In use, each CTT can be programmed to a desired on-resistance state, e.g. at least a high on-resistance state HI or a low on-resistance state LO, by programming the threshold voltage $V_T$ accordingly. This varies the series on-resistance of the relevant branch and hence the overall on-resistance of the multi-level programmable resistance cell 2900 as will be understood by one skilled in the art. The values of the resistances R0 and RF (if present) and R1 to RN are selected to provide appropriate weightings for each parallel branch so as to provide a multi-level range of programmable resistances for the multi-level programmable resistance cell 2900. Thus the CTTs are associated with different weighted bit portions which can be separately programmed.

In the example of FIG. 29, each CTT is connected with its source terminal connected to a common source node, terminal B in this example terminal B, and any resistance in series with the CTT in a branch is connected on the drain side of the CTT device. This means that all of the CTTs are connected with their source terminal connected to the common source node. The voltage at the common source node, e.g. terminal B, can thus be controlled, in use for data output from the memory cell, to be at a defined reference voltage, which means that the same gate voltage can be applied to all of the CTTs to achieve the same gate-source voltage Vas for each of the CTTs.

Figure 30:
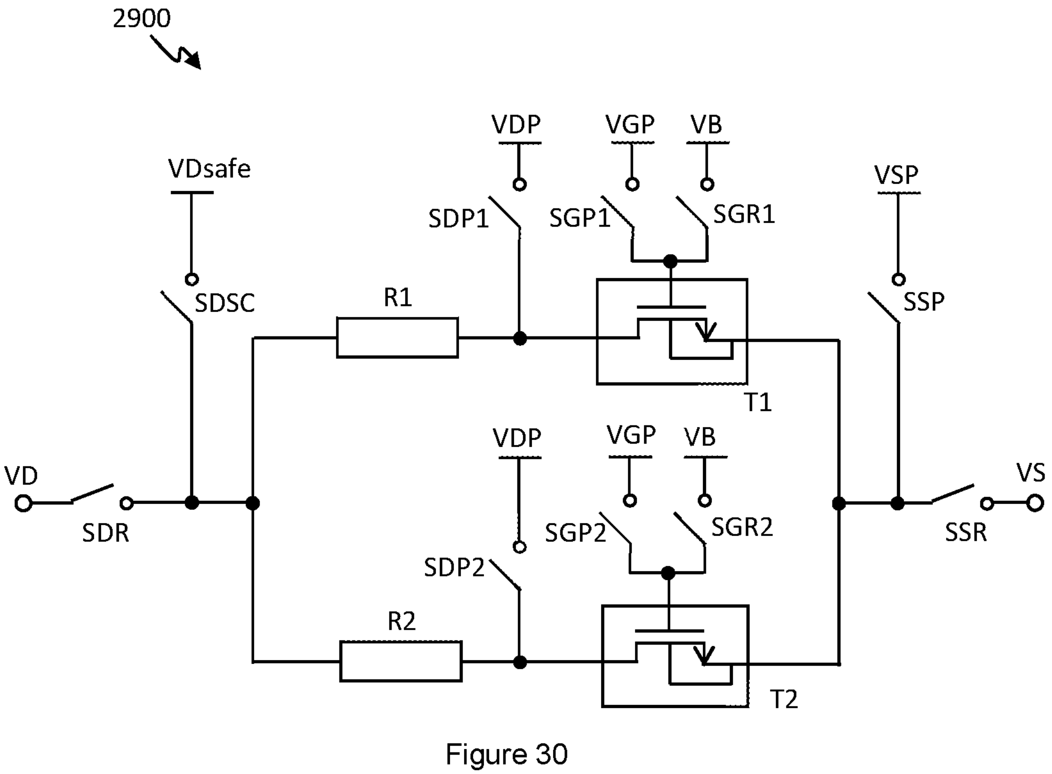
FIG. 30 illustrates how the charge-trapping transistors of a memory cell such as shown in FIG. 29 may be programmed.

FIG. 30 illustrates how the CTTs of the parallel branches of the example of FIG. 29 may be programmed in a programming mode. FIG. 30 illustrates just two parallel branches for clarity, but it will be understood that other branches could be programmed in the same way.

The CTTs in the parallel branches may be programmed sequentially one by one in the programming mode. To programme CTT T1, a defined drain-source voltage is applied across that CTT by connecting the drain to a defined programming drain voltage VDP via switch SDP1 and connecting the common source node to a defined programming source voltage VSP via switch SSP. The gate of CTT T1 is then connected to a gate programming voltage VGP by switch SGP1. The gate programming voltage VGP may, during programming of CTT T1, have a magnitude which is greater than the gate voltage applied, in use, for reading a value from the memory cell and which is selected to cause trapping or de-trapping of charge in the CTT as appropriate. In some cases, the gate programming voltage VGP may comprise a series of voltage pulses or some other varying voltage waveform.

During the programming of CTT T1, the programming source voltage VSP is applied to the common source node, and thus will also be applied to the source of CTT T2. To control the voltage across CTT T2 which is not being programmed, the drain of CTT T2 (and any other CTT not being programmed) may be biased to a known safe voltage. This safe voltage could be applied directly to the drain of each CTT which is not being programmed, but to reduce the overall number of switches for examples where there are more than two parallel branches having CTTs, a safe voltage VDsafe may be applied to a node in common with all of the parallel branches via switch SDSC, which provides a safe voltage to the drain of each of the CTTs which is not being programmed. However, this arrangement does mean that when the programming drain voltage is applied to the drain of CTT T1 and the safe voltage VDSafe is applied to the node in common with all the parallel circuit branches, a voltage difference could be developed across fixed resistor R1, which could lead to some current flow and the voltages may be controlled to avoid undue current flow. Whilst CTT T1 is being programmed, the gate of CTT T2 (and any other CTT not being programmed) may likewise be controlled to a known safe voltage which is below a programming threshold to avoid unwanted charge trapping or de-trapping in this CTT.

Note that FIG. 30 illustrates that the bulk of each of the CTTs may be connected to the source electrode, so that bulk of the CTT is biased to the same voltage as the source, which is a relatively simple and straightforward implementation. In some examples, however, the CTT may be configured such that the bulk of the CTT can be selectively biased to a different voltage during the programming mode, as varying the biasing of the bulk of the CTTs during programming can be beneficial to aid charge trapping or release, at the expense of requiring some additional switches for the bulk terminals of the CTTs.

Once CTT T1 has been suitably programmed, switch SDP1 may be opened to disconnect the drain of CTT T1 from the drain programming voltage, so that the drain of CTT T1 is driven to the safe voltage VDSafe, and the gate of CTT T1 driven to a voltage which is below the programming threshold. Switch SDP2 is closed to connect the drain of CTT T2 to the drain programming voltage VDP and the gate of CTT T2 is then driven to an appropriate programming voltage VGP to cause charge trapping or de-trapping as appropriate. This operation will then be repeated for each parallel branch until all the CTTs have been programmed appropriately.

Subsequently, for data output, the programmed memory cell 2900 may be operated in an output mode, in which the common source node may be connected to the defined source reference voltage VS by switch SSR. The gates of the CTTs T1 and T2 may each be connected to a bias voltage VB by respective switches SGR1 and SGR2 so that the same gate-source voltage Vas is applied to each of the CTTs. Each of switches SDP1, SDP2 and SDCP will be open, so the drains of the CTTs are disconnected from both the drain programming voltage VDP and safe drain voltage VDSafe, and switch SDR may be closed to provide a suitable voltage VD for allowing data output from the multi-level programmable resistance cell. Depending on the application, the voltage VD which is applied may be a defined read voltage, but in some applications, the voltage VD which is applied may depend on a data input.

Figure 31:
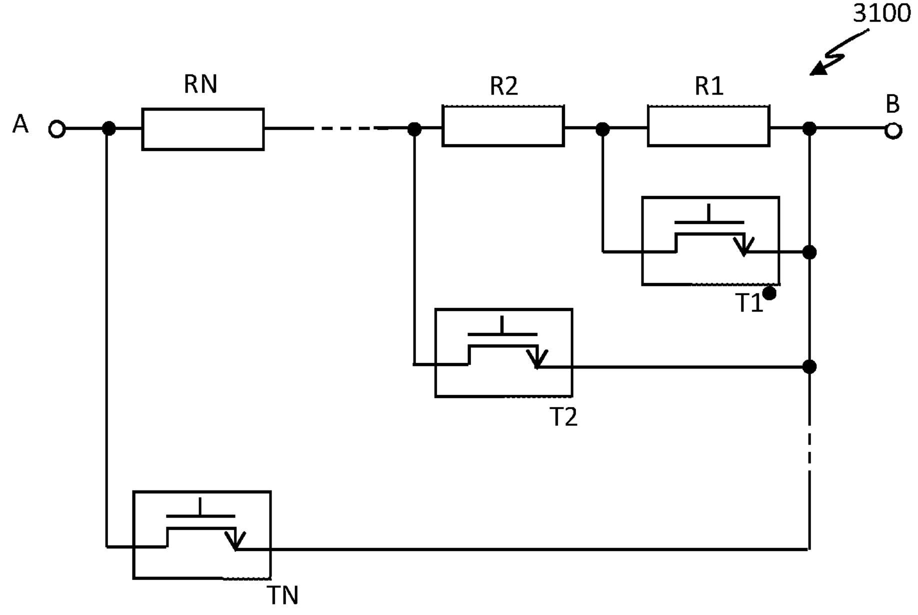
FIG. 31 illustrates another example of a multi-level programmable resistance memory cell formed from a plurality of charge-trapping transistors having a common source node.

FIG. 31 illustrates an alternative example of a multi-level programmable resistance cell 3100 formed from CTTs according to an embodiment. In this example, a series connection of resistors R1 to RN is arranged between the two terminals A and B of the multi-level memory cell 1000, with CTTs T1 to TN nested in parallel with different numbers of the series connected resistors. The multi-level memory cell 3100 is similar to that discussed with reference to FIG. 10*b*, but implemented with CTTs and omitting element M0 of FIG. 10*b*, such that the source of each of the CTTs is connected to terminal B. Again, this means that the voltage at terminal B can be controlled to be at a defined reference voltage, and the same gate voltage can be applied to all of the CTTs to achieve the same gate-source voltage Vas for each of the CTTs.

In use, programming the CTTs to different on-resistance states varies the overall on-resistance of the memory cell 3100 as will be understood by one skilled in the art.

Figure 32:
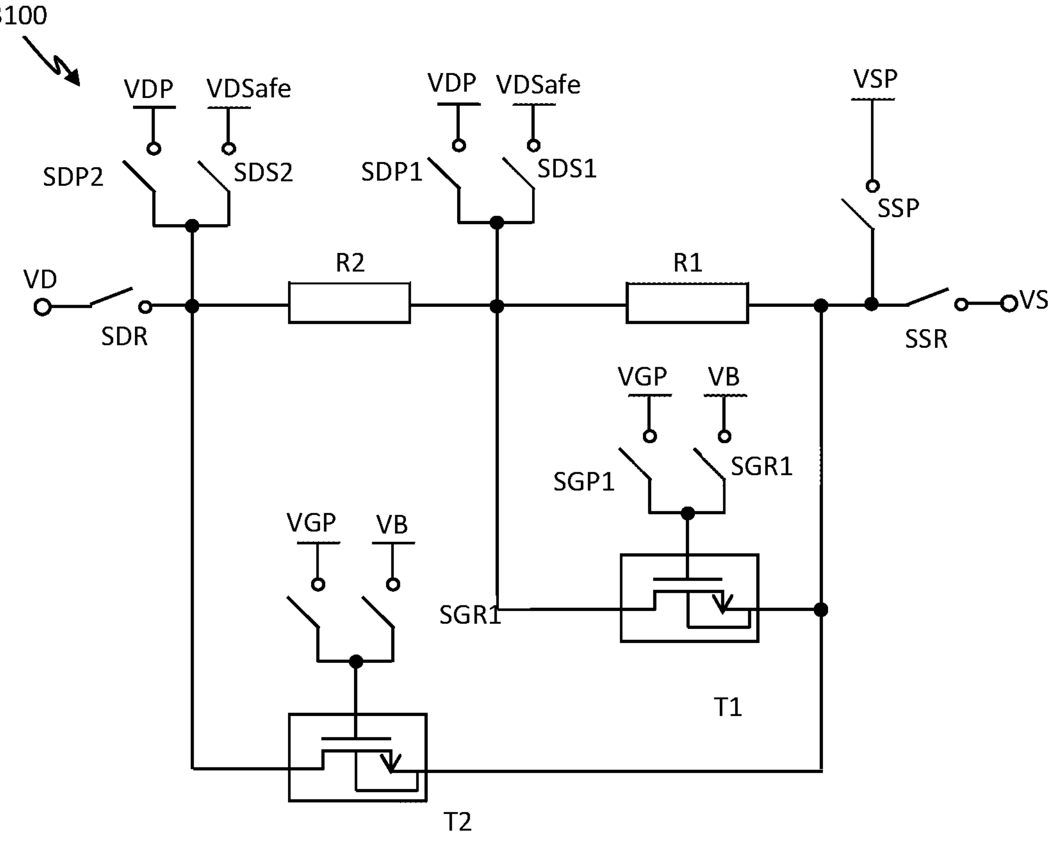
FIG. 32 illustrates how the charge-trapping transistors of a memory cell such as shown in FIG. 31 may be programmed.

FIG. 32 illustrates how the CTTs of the nested loops of the example of FIG. 31 may be programmed, and in FIG. 32 switches and voltages that provide a similar functionality as discussed with reference to FIG. 30 are identified by the same labels. FIG. 32 illustrates just two loops for clarity, but it will be understood that other CTTs in additional loops could be programmed in the same way.

Like the example discussed with reference to FIG. 30, the CTTs may be programmed sequentially one-by-one during a programming mode. During programming of the CTTs, a programming source voltage VSP is applied to the common source node and a programming drain voltage VDP applied to the CTT being programmed by the relevant switch, e.g. to CTT T1 by switch SDP1 or to CTT T2 by switch SDP2. As with the example of FIG. 30, the drains of the CTTs not being programmed may be driven to a safe voltage VDSafe, e.g. via switch SDS1 for CTT T1 and switch SDS2 for CTT T2 (although again this may cause a voltage difference across some of the fixed resistors which can lead to current flow). The gate of the CTT being programmed is connected to be driven by a suitable gate programming voltage VGP to cause charge trapping or de-trapping as appropriate, whilst the gates of the other CTTs may be controlled to a suitable low voltage to avoid unwanted programming.

For data output, the drains of the CTTs are disconnected from the drain programming voltage, the common source node is connected to the defined reference voltage VS and the gates of the CTTs are connected to the bias voltage VB to apply the same gate source voltage Vas to all of the CTTs.

In each of the examples of FIGS. 30 and 32, the CTTs are programmed sequentially. In some implementations, the programming of the CTTs in the programming mode may involve a tuning process that allows for fine tuning of the setting of the resistances of the CTTs and hence the resistance of the programmable resistance memory cell.

When setting the on-resistance state of each of the CTTs in turn, the programming voltage used can be adjusted to increase or decrease the amount of charge trapping (or de-trapping) for the CTTs. Thus, for example, consider programming of the two parallel branches illustrated in FIG. 30. The on-resistance of the cell 2900 may be determined in an initial state, e.g. by operating in the output mode and applying a defined voltage VD. CTT T1 may then be programmed to the desired resistance state for that CTT and then the resistance of the cell may be determined again. If the change in resistance as a result of the programming of CTT T1 is different from what is expected, then the programming voltages used can be adjusted as necessary for programming CTT T2 to compensate.

For instance, if the resistance change measured as a result of programming CTT T1 is lower than expected, then the programming of CTT T2 may be adjusted to increase the shift in the threshold voltage $V_T$, whereas if the resistance change is larger than expected, then the programming of CTT T2 may be adjusted to decrease the shift in the threshold voltage $V_T$. This can be extended to the programming of additional CTTs as necessary.

Note that it would alternatively or additionally be possible to monitor the on-resistance of the individual CTT, rather than the whole memory cell, before and after programming to determine any necessary compensation, but as it is the overall on-resistance of the cell that is used to store the relevant data, it may be most efficient and/or accurate to monitor the cell on-resistance.

In general, the CTTs corresponding to each bit of the multi-level programmable resistance cell may be programmed and tuned in sequence, with the programming of each CTT in the sequence being adjusted based on the programming of the previous CTTs so as to improve the accuracy of the programming of the memory cell as a whole. Thus, a first CTT may be programmed, and the resistance of the cell measured, and the programming of the next CTT adjusted as necessary to take account of any variation in the actual resistance of the cell from the desired value, which can improve the accuracy of the overall programming.

It will be understood that the on-resistance value of a CTT can be tuned by varying the amount of charge trapped and hence the resulting threshold voltage $V_T$ of the CTT, but could also be tuned by controllably varying the gate source voltage $V_{GS}$ applied to that CTT during the output mode. However, as noted above, providing tuned gate voltages for each of the CTTs may add to the complexity of the circuitry and thus tuning the threshold voltages in the programming process may be preferable. In some implementations, however, there could be a plurality of different bias voltages that could be selectively used as gate voltages for the CTTs, which could allow for at least some tuning of the resistance values of the programmed CTTs.

Another way in which the on-resistance of each individual CTT could be tuned could be to vary the bulk biasing of the transistor in the output mode and in some examples the bulk voltage applied to the bulk of the transistor may be controllably varied. However, controlling the bulk voltage in this way may also add some complexity and may have some complications of non-linearity.

The ability to provide tuning of the resistance of the CTT element, e.g. by fine tuning of the threshold voltage, may, in some cases, allow some design constraints on the accuracy of the fixed resistors to be relaxed, which could be beneficial in circuit area and/or cost.

Typically resistors formed as part of an integrated circuit may be made relatively large to reduce the impact of any process variations, i.e. to reduce the extent of part-to-part variations. A given value of resistance can generally be achieved by different sizes of resistor, but, for larger resistors, the effect of any process variations will generally have a smaller proportional impact on the resistance value for the resistor than for a smaller resistor. The resistors in an integrated circuit may therefore be designed to be a certain size to meet some defined tolerance in resistor value.

In embodiments of the present disclosure, where the CTT is arranged together with one or more fixed resistors so as to provide a controlled variation in resistance for the memory cell, the ability to tune the resistance variation of the CTT may also be used to at least partly compensate for any process variations in the fixed resistors, i.e. any variation in the actual resistance value from a nominal design value, which may allow the performance tolerance for the fixed resistors to be relaxed, allowing them to be smaller in size.

A multi-level programmable resistance CTT memory cell according to embodiments of the disclosure can thus be programmed to any of at least three different resistance values by programming the CTTs to one of a plurality of different resistance states, with tuning of the programming of the CTTs to achieve the desired overall resistance value.

Figure 33A:
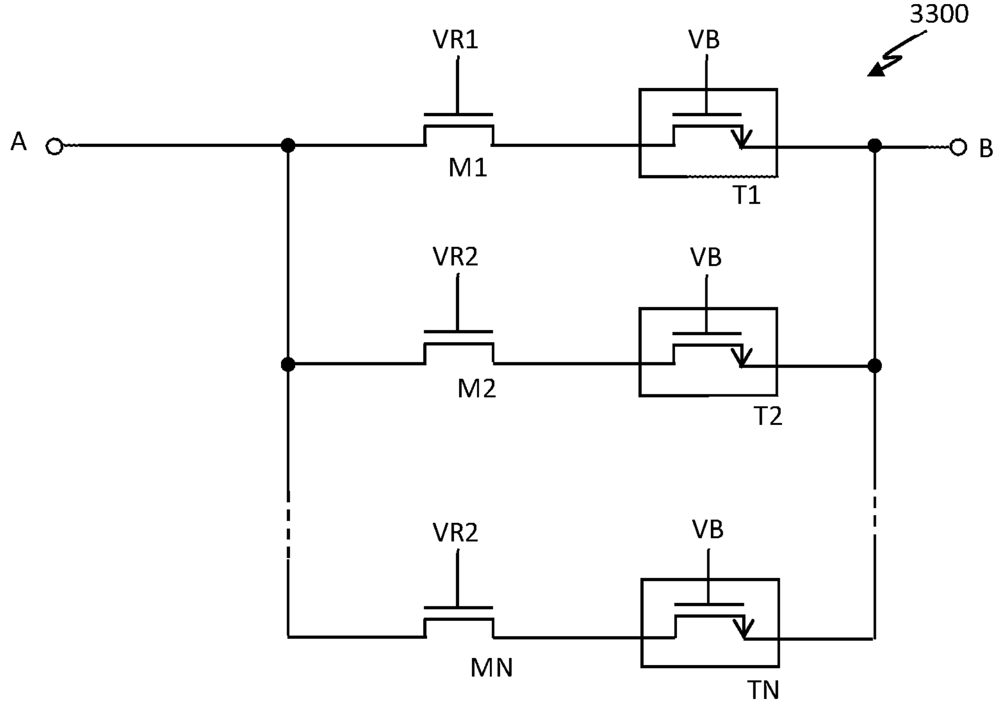
FIGS. 33*a* and 33*b* illustrate another example of a multi-level programmable resistance memory cell formed from charge-trapping transistors and active resistance devices.

Whilst the preceding examples have been discussed in the context to the CTTs being connected in a resistance network with fixed resistances implemented by resistors, in some examples, the functionality of the fixed resistance may instead be provided by using active devices rather than a resistor. For example, FIG. 33*a* illustrates an example of a multi-level programmable resistance cell 3300 which comprises a resistance network with a plurality of parallel branches in a similar manner as discussed with reference to FIG. 29, but in the example of FIG. 33*a* each parallel branch comprises a CTT T1 . . . TN in series with a respective active device M1 . . . MN which is controlled to provide a desired resistance value. Each of the active device may comprise a suitable transistor which may be controlled to provide a suitable on-resistance.

Figure 33B:
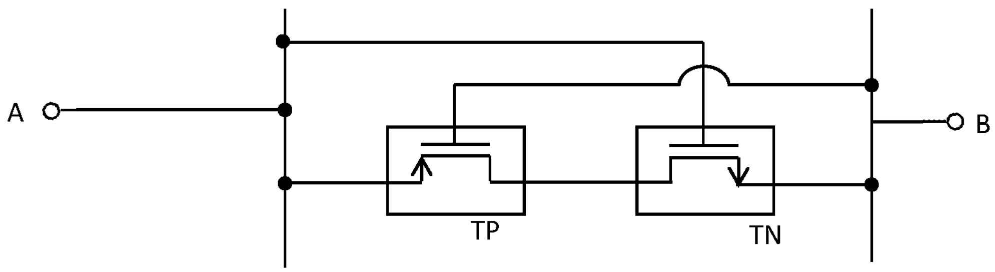

The active devices M1 to MN could be implemented as conventional (non charge trapping) transistors, in which case the gate of each transistor M1 to MN could be biased by a respective bias voltage VR1 to VRN. In some examples, however, the active devices M1 to MN could themselves be implemented by CTTS which are programmed to provide the desired on-resistance. Thus, the parallel branches could comprise two CTTs in series. Advantageously, the two CTTs could comprise a p-channel CTT and an n-channel CTT, e.g. a PMOS CTT and an NMOS CTT which are connected together by their drains. In this way the source elements of the NMOS CTTs in the different branches can be connected to a common NMOS source node on one side of the parallel branches whilst the source elements of the PMOS CTTs in the different branches can be connected to a common PMOS source node on the other side of the parallel branches, allowing the a first gate voltage to be applied to all the PMOS CTTs to apply a constant gate-source voltage for the PMOS CTTs and a second gate voltage to be applied to all the NMOS CTTs to apply a constant gate-source voltage for the NMOS CTTs. In some cases, the first gate voltage for the PMOS CTTs may be the same as the source voltage for the NMOS CTTs and the second gate voltage for the NMOS CTTs may be the same as the source voltage for the PMOS CTTs, as illustrated in FIG. 33*b*, which illustrates just one of the parallel branches implemented with a PMOS and NMOS CTT in series connected by their drains. This arrangement provides a compact self-biasing structure in which no external bias is needed for the gates of the CTTs. In use one of the CTTs could be programmed to provide a fixed on-resistance value that provides an appropriate weighting for that parallel branch and which does not vary in use, i.e. which is not varied in the programming mode of the memory cell, whilst the other CTT could be (re-)programmable in the programming mode to store data. In some cases however both of the CTTs could be programmable in the programming mode to provide a desired resistance for the branch.

Figure 34A:
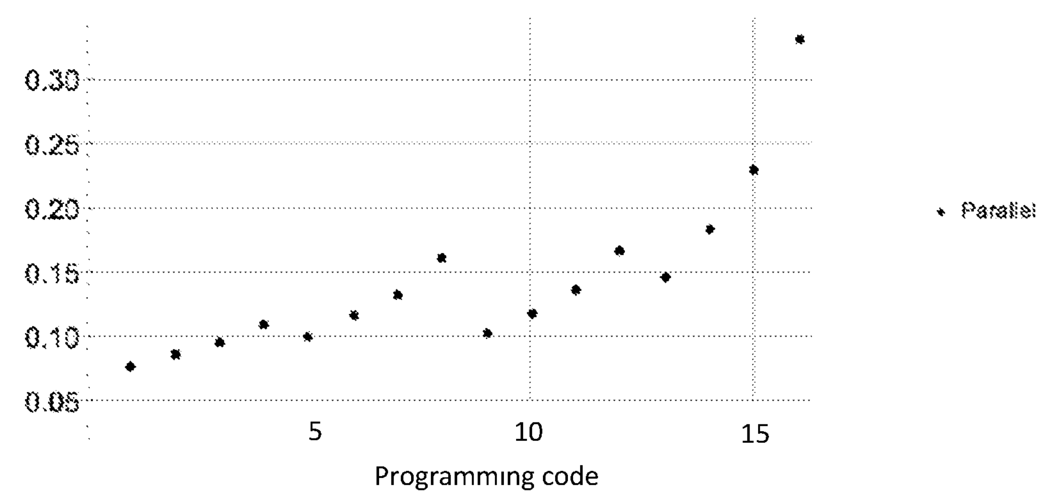
FIGS. 34*a* and 34*b* illustrate how the resistance of a memory cell which is not monotonic with programming code may be mapped to a re-ordered code sequence.
Figure 34B:
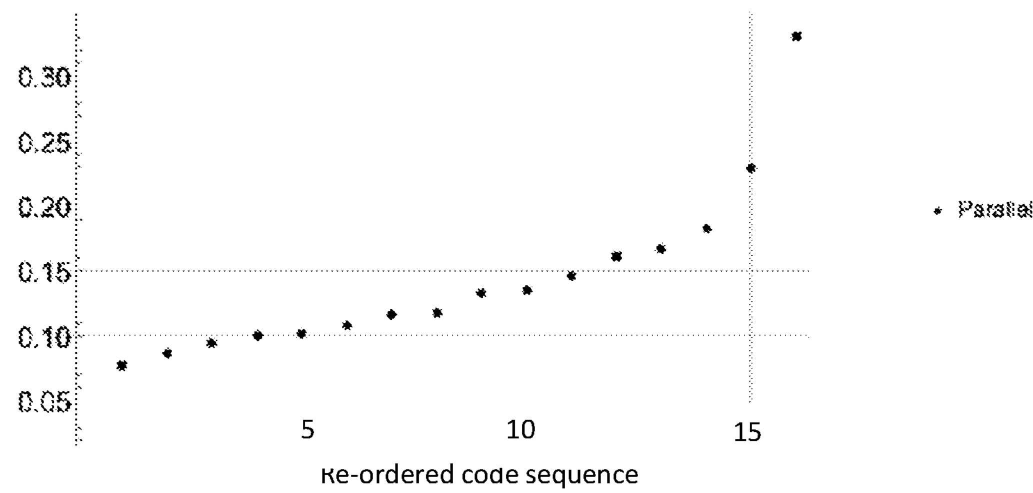

In some cases, depending on the coefficients of the resistances, the resistance of the multi-level programmable resistance cell may not be monotonic with programming code. For instance, consider a multi-level programmable resistance cell similar to that described with reference to FIG. 29, with four parallel branches each comprising a CTT. If each of the four different CTTs can be programmed to a high on-resistance state HI or a low on-resistance state LO, there would be sixteen different code words for programming the multi-level resistance cell. However, for some implementations the sequence of code words may not be monotonic with on-resistance for the memory cell. FIG. 34*a* illustrates a plot of how the on-resistance of an example cell may vary with programming code word in a way which is not monotonic. In such a case, the sequence of programming code words can effectively be reordered to provide a monotonic variation in on-resistance. FIG. 34*b* illustrates a re-ordered code sequence which corresponds to the sequence {1, 2, 3, 5, 9, 4, 6, 10, 7, 11, 13, 8, 12, 14, 15, 16} of the programming codes. In use therefore, input codes for requesting a specific on-resistance value may be translated into the relevant programming code that provides the correct value.

The examples of CTT based memory cells above have been described on the basis that each of the CTTs is implemented to be programmable between two or more different on-resistances states (for a defined gate source voltage $V_{GS}$), where the CTTs are each designed and controlled so as to exhibit the same resistance states as one another, and to have the same nominal variation ΔR in resistance between corresponding on-resistance states (subject to any variations implemented as part of the tuning of the programmed resistance cell). That is, each of the CTTs is implemented so that the variation in resistance ΔR between any two equivalent on-resistance states is substantially the same for each of the CTTs, e.g. for CTTs controlled to vary between just two different on-resistance states HI and LO, the variation in resistance ΔR between the HI and LO resistances states is the same for each of the CTTs.

In some applications, however, at least some of the CTTs may be implemented so as to provide different nominal variations in on-resistance from one another when switching between different on-resistance states, i.e. to provide different values of ΔR from one another.

From the equation for the drain-source resistance $R_{DS}$ it will again be noted that the resistance of the CTTs depends on the gate source voltage Vas, the threshold voltage $V_T$ and the ratio W/L for the CTT. In addition, it will be understood that biasing the bulk of the CTT could also vary the baseline threshold voltage (in the absence of any trapped charge) via the body effect. In some cases, one or more of these parameters could be varied to provide different ΔR values for different CTTs.

The gate source voltage Vas could be varied by using different bias voltages for the gate and/or source connections of one or more CTTs. For instances, a first set of one or more CTTs may be operated, for read-out, with a first gate-source voltage and a second set of one or more CTTs may be operated with a second, different gate-source voltage. At least one of the gate voltage and the source voltage will be different for the first set compared to the second set. Additionally or alternatively, different CTTs could be programmed to have significantly different variations in threshold voltage $V_T$, i.e. to vary the steps in $V_T$ between successive resistance states of the CTT by varying the amount of change in trapped charge. Additionally, or alternatively, at least some CTTs could have a different bulk bias voltage apply, so as to vary the baseline threshold voltage via the body effect, e.g. some CTTs could have their bulk tied to the source electrodes, whereas other may have the bulk biased by a different bias voltage.

Figure 35:
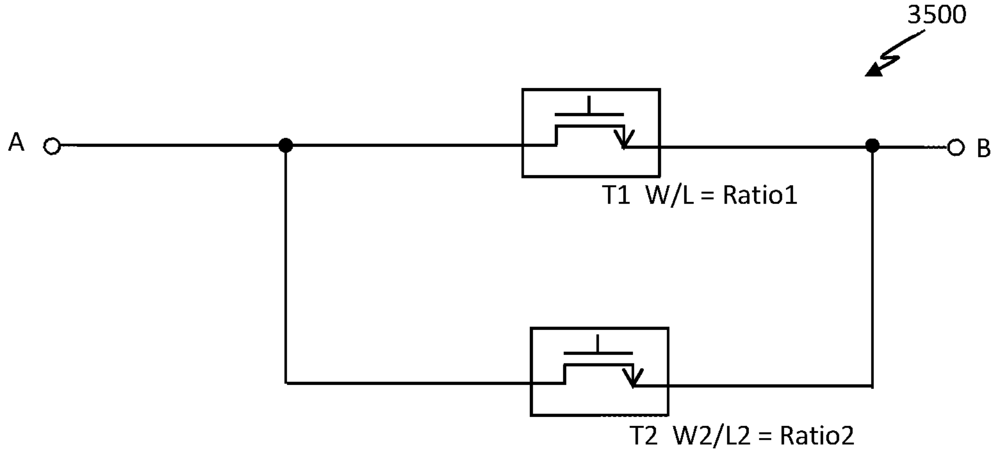
FIG. 35 illustrates one example of a multi-level programmable resistance memory cell formed from a charge-trapping transistors with different W/L ratios.

In some examples, however, at least some CTTs may be implemented to have different ratios of W/L to one another. FIG. 35 illustrates an example of a programmable resistance cell 3500 comprising first and second CTTs T1 and T2 in parallel, where the first CTT T1 has a ratio of channel width W to length L that equates to a first ratio value and the second CTT T1 has a ratio of channel width W to length L that equates to a second, different, ratio value. The change in resistance is inversely proportional to $(W/L).\Delta V_T$, where $\Delta V_T$ is the variation in threshold voltage between any two on-resistance states, so if the first ratio of W/L for first CTT T1 is double that of the second ratio of W/L for first CTT T2, the change in resistance, ΔR, for the first CTT T1 will be half the change in resistance, ΔR, for the second CTT T2 for the same change in threshold voltage.

In general therefore, a multi-level programmable resistance cell using CTTs may comprise a resistance network between two terminals, which may be referred to as first and second resistance nodes. The resistance network comprises a plurality of CTTs and, in at least some examples, the CTTs may be arranged as part of the resistance network with one or more fixed resistances to implement weighted bit portions of the memory cell and/or with active devices controlled to provide a desired resistance. The CTTs may be programmed to any of a plurality of discrete resistance states by varying the charge trapped by the CTT and the programmed cell can be used for data output by driving all the CTTs with a defined gate-source voltage, which in some cases may be substantially the same gate-source voltage for at least a first set of two or more of the CTTs.

A multi-level programmable resistance cell using CTTs according to embodiments of this disclosure may be used in any application where it may be desirable to be able to program an element of a circuit to any of a number of different resistance values that may persist in the absence of applied power. For instance, a multi-level programmable resistance cell using CTTs may be used as part of an analog computing circuit in a similar way as discussed previously with respect to the multilevel memristor element and a multi-level programmable resistance cell implemented using CTTs, such as any of the examples discussed with reference to FIGS. 29 to 33, may be used as the multi-level programmable element as discussed with reference to any of FIGS. 12 to 23.

Figure 36:
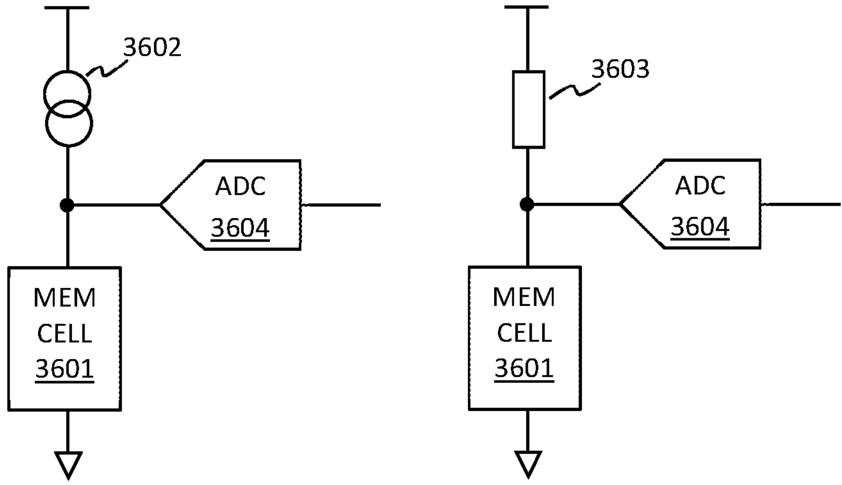
FIG. 36 illustrates options for data read out from a multi-level programmable resistance memory cell.

A multi-level programmable resistance cell using CTTs could, in some applications, be implemented as multi-bit digital memory cell. FIG. 36 illustrates two examples of a how such a memory cell 3601 may be arranged for read-out. The memory cell 3601 may comprise a multi-level programmable resistance cell such as discussed with reference to any of FIGS. 29 to 33. The memory cell 3601 may be programmed to store a multi-bit data value as discussed above. For read-out of the stored data from the memory cell 3601, the memory cell 3601 will be operated in the data output mode and either a defined current from a current source 3602 could be driven into terminal A of the memory cell as illustrated on the left-hand side of FIG. 36, or the memory cell 3601 could be arranged as part of a potential divider with fixed resistance 3603 as illustrated on the right-hand side of FIG. 36. In either case, the other side of the memory cell, i.e. terminal B, may be connected to a defined reference voltage, such as ground, which can provide the defined reference voltage for the common source node. The resulting voltage at terminal A to the memory cell, which depends on the stored resistance value of the memory cell, can be determined by an ADC 3604. In implementations with multiple memory cells (not illustrated), the ADC 3604 could be multiplexed between the different memory cells to provide sequential read-out from the memory cells and in some cases the various memory cells could be addressed via bit-lines and word-lines as would be understood by one skilled in the art.

In general therefore some embodiments relate to a programmable resistance element, the programmable resistance element comprising a plurality of programmable-resistance memory components arranged in combination between first and second terminals of the multi-level element to define a plurality of programmable portions, wherein each programmable portion comprises one or more of said programmable-resistance memory configured such that each programmable portion can be individually programmed to a selected one of at least two different resistance states, and wherein said plurality of programmable portions can be programmed in combination to provide a selected one of more than two values of overall resistance between the first and second terminals.

The invention is not limited to the embodiments described herein, and may be modified or adapted without departing from the scope of the present invention.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A multi-level programmable resistance memory cell comprising:

first and second resistance nodes; and a programmable resistance network connected between the first and second resistance nodes, wherein the programmable resistance network comprises a first plurality of charge-trapping-transistors;

wherein the multi-level programmable resistance memory cell is operable in:

a programming mode to selectively programme each of the first plurality of charge-trapping-transistors to a selected on-resistance state by programming an amount of charge trapped in the charge-trapping-transistor; and an output mode in which each of the first plurality of charge-trapping-transistors is driven with a respective gate-source voltage;

wherein the multi-level programmable resistance memory cell is configured such that a cell resistance between the first and second resistance nodes in the output mode can be selectively varied between at least three different resistance values by programming of the first plurality of charge-trapping-transistors in the programming mode;

wherein each of said first plurality of charge-trapping-transistors is arranged in a respective one of a plurality of parallel branches of the resistance network; and wherein one or more of said parallel branches of the resistance network comprise a fixed resistor in series with the charge-trapping-transistor, where the resistance value of the fixed resistor is different in different parallel branches.

2. The multi-level programmable resistance memory cell of claim 1 wherein the resistance network is configured so that each of said first plurality of charge-trapping-transistors is configured as part of a respective weighted bit portion of the multi-level programmable resistance memory cell, such that programming the charge-trapping-transistor programmes a corresponding weighted bit of the multi-level programmable resistance memory cell.

3. The multi-level programmable resistance memory cell of claim 1 wherein for a first set of two or more of said first plurality of charge-trapping-transistors, each of the charge-trapping-transistors of the first set has a source electrode connected to a common source node.

4. The multi-level programmable resistance memory cell of claim 3 wherein the first set comprises all of said first plurality of charge-trapping-transistors.

5. The multi-level programmable resistance memory cell of claim 3 configured such that, in the output mode, a gate electrode of each of the first plurality of charge-trapping-transistors of the first set is connected to a common bias voltage.

6. The multi-level programmable resistance memory cell of claim 1 wherein, for each of said one or more of said parallel branches of the resistance network comprise the fixed resistor in series with the charge-trapping-transistor, the fixed resistor is connected to a drain electrode of the charge-trapping-transistor.

7. The multi-level programmable resistance memory cell of claim 1 configured such that, in the output node, at least some of the first plurality of charge-trapping-transistors are driven with different gate-source voltages to one another.

8. The multi-level programmable resistance memory cell of claim 1 configured such that at least some of the first plurality of charge-trapping-transistors are configured to have a different ratio of channel length to channel width to one another.

9. The multi-level programmable resistance memory cell of claim 1 configured such that at least some of the first plurality of charge-trapping-transistors are configured to have a different bulk bias voltage to one another.

10. An analog computing circuit comprising the multi-level programmable resistance memory cell of claim 1.

11. A digital memory comprising the multi-level programmable resistance memory cell of claim 1.

12. A multi-level programmable resistance memory cell comprising:

first and second resistance nodes; and a programmable resistance network connected between the first and second resistance nodes, wherein the programmable resistance network comprises a first plurality of charge-trapping-transistors;

wherein the multi-level programmable resistance memory cell is operable in:

a programming mode to selectively programme each of the first plurality of charge-trapping-transistors to a selected on-resistance state by programming an amount of charge trapped in the charge-trapping-transistor; and an output mode in which each of the first plurality of charge-trapping-transistors is driven with a respective gate-source voltage;

wherein the multi-level programmable resistance memory cell is configured such that a cell resistance between the first and second resistance nodes in the output mode can be selectively varied between at least three different resistance values by programming of the first plurality of charge-trapping-transistors in the programming mode;

wherein each of said first plurality of charge-trapping-transistors is arranged in a respective one of a plurality of parallel branches of the resistance network; and wherein one or more of said parallel branches of the resistance network comprises an active resistance element configured to provide an on-resistance value in series with the charge-trapping-transistor, wherein the active resistance element comprises a transistor.

13. The multi-level programmable resistance memory cell of claim 12 wherein the active resistance element comprises a charge-trapping-transistor of a second plurality of charge-trapping-transistors.

14. The multi-level programmable resistance memory cell of claim 13 wherein:

the first plurality of charge-trapping-transistors comprise n-channel transistors and the second plurality of charge trapping transistors comprise p-channel transistors or vice versa; and in said one or more of said parallel branches, a drain of the charge-trapping-transistor of the first plurality is connected to a drain of the charge trapping transistor of the second plurality.

15. The multi-level programmable resistance memory cell of claim 14 wherein:

a gate of the charge-trapping-transistor of the first plurality is connected to a source voltage of the charge-trapping-transistor of the second plurality; and a gate of the charge-trapping-transistor of the second plurality is connected to a source voltage of the charge-trapping-transistor of the first plurality.

16. A multi-level programmable resistance memory cell comprising:

first and second resistance nodes; and a programmable resistance network connected between the first and second resistance nodes, wherein the programmable resistance network comprises a first plurality of charge-trapping-transistors;

wherein the multi-level programmable resistance memory cell is operable in:

a programming mode to selectively programme each of the first plurality of charge-trapping-transistors to a selected on-resistance state by programming an amount of charge trapped in the charge-trapping-transistor; and an output mode in which each of the first plurality of charge-trapping-transistors is driven with a respective gate-source voltage;

wherein the multi-level programmable resistance memory cell is configured such that a cell resistance between the first and second resistance nodes in the output mode can be selectively varied between at least three different resistance values by programming of the first plurality of charge-trapping-transistors in the programming mode;

wherein each of said first plurality of charge-trapping-transistors is arranged in a respective one of a plurality of parallel branches of the resistance network; and wherein said resistance network comprises a plurality of series connected fixed resistors and wherein each of said first plurality of charge-trapping-transistors is connected in parallel with a different number of said series connected fixed resistors.

17. A multi-level programmable resistance memory cell comprising:

first and second resistance nodes; and a programmable resistance network connected between the first and second resistance nodes, wherein the programmable resistance network comprises a first plurality of charge-trapping-transistors;

wherein the multi-level programmable resistance memory cell is operable in:

a programming mode to selectively programme each of the first plurality of charge-trapping-transistors to a selected on-resistance state by programming an amount of charge trapped in the charge-trapping-transistor; and an output mode in which each of the first plurality of charge-trapping-transistors is driven with a respective gate-source voltage;

wherein the multi-level programmable resistance memory cell is configured such that a cell resistance between the first and second resistance nodes in the output mode can be selectively varied between at least three different resistance values by programming of the first plurality of charge-trapping-transistors in the programming mode; and configured to programme said first plurality of charge-trapping-transistors in a sequential process; and configured such that, in the programming mode, a value for on-resistance of the multi-level programmable resistance memory cell is determined after programming of each charge-trapping-transistor in said sequential process and wherein the programming of a subsequent charge-trapping-transistor in said sequential process is controlled to compensate for any inaccuracy in said determined value for on-resistance of the multi-level programmable resistance memory cell.

18. The multi-level programmable resistance memory cell of claim 17 configured to determine a resistance change in on-resistance after programming of each charge-trapping-transistor and to control programming a subsequent charge-trapping-transistor in said sequential process to:

increase a shift in threshold voltage of that subsequent charge-trapping-transistor if the determined resistance change is lower than expected; and decrease the shift threshold voltage of that subsequent charge-trapping-transistor if the determined resistance change is larger than expected.

* * * * *